(12) United States Patent
Osumi et al.

(10) Patent No.: US 11,798,870 B2
(45) Date of Patent: Oct. 24, 2023

(54) SEMICONDUCTOR DEVICE

(71) Applicant: ROHM CO., LTD., Kyoto (JP)

(72) Inventors: Yoshizo Osumi, Kyoto (JP); Hiroaki Matsubara, Kyoto (JP); Tomohira Kikuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 232 days.

(21) Appl. No.: 17/468,111

(22) Filed: Sep. 7, 2021

(65) Prior Publication Data

US 2022/0102252 A1 Mar. 31, 2022

(30) Foreign Application Priority Data

Sep. 29, 2020 (JP) .................................. 2020-163107

(51) Int. Cl.
*H01L 23/495* (2006.01)
*H01L 21/56* (2006.01)
*H01L 25/065* (2023.01)
*H01L 23/00* (2006.01)

(52) U.S. Cl.
CPC ...... *H01L 23/49575* (2013.01); *H01L 21/565* (2013.01); *H01L 23/49503* (2013.01); *H01L 23/49541* (2013.01); *H01L 24/48* (2013.01); *H01L 25/0655* (2013.01); *H01L 2224/48137* (2013.01); *H01L 2224/48247* (2013.01); *H01L 2924/1425* (2013.01); *H01L 2924/18165* (2013.01)

(58) Field of Classification Search
CPC ......... H01L 23/49575; H01L 23/49503; H01L 23/49541; H01L 21/565; H01L 24/48
See application file for complete search history.

(56) References Cited

U.S. PATENT DOCUMENTS

2004/0212017 A1* 10/2004 Mizuno ................. H01L 23/576
257/374
2016/0027732 A1* 1/2016 Igarashi ............. H01L 23/5227
257/531

FOREIGN PATENT DOCUMENTS

JP 2014-155412 A 8/2014

\* cited by examiner

*Primary Examiner* — Marc Anthony Armand
(74) *Attorney, Agent, or Firm* — HAMRE, SCHUMANN, MUELLER & LARSON, P.C.

(57) ABSTRACT

There is provided a semiconductor device including: a conductive support including a first die pad and a second die pad having a potential different from a potential of the first die pad; a first semiconductor element mounted on the first die pad; a second semiconductor element mounted on the second die pad; and a sealing resin that covers the first semiconductor element, the second semiconductor element, and at least a portion of the conductive support.

16 Claims, 19 Drawing Sheets

US 11,798,870 B2

SEMICONDUCTOR DEVICE

CROSS-REFERENCE TO RELATED APPLICATION(S)

This application is based upon and claims the benefit of priority from Japanese Patent Application No. 2020-163107, filed on Sep. 29, 2020, the entire contents of which are incorporated herein by reference.

TECHNICAL FIELD

The present disclosure relates to a semiconductor device in which signals are transmitted via an insulating part between a plurality of semiconductor elements mounted in one package.

BACKGROUND

Semiconductor devices are used in inverter devices used in electric vehicles, hybrid vehicles, home appliances, and the like. The inverter device includes, for example, a semiconductor device and a power semiconductor such as an IGBT (Insulated Gate Bipolar Transistor) or a MOSFET (Metal Oxide Semiconductor Field Effect Transistor). The semiconductor device includes a control element and a drive element. In the inverter device, a control signal output from an ECU (Engine Control Unit) is input to the control element of the semiconductor device. The control element converts the control signal into a PWM (Pulse Width Modulation) control signal and transmits the PWM control signal to the drive element. The drive element causes, for example, six power semiconductors to perform a switching operation at a desired timing based on the PWM control signal. As the six power semiconductors perform the switching operation at the desired timing, three-phase AC power for driving a motor is generated from DC power of a vehicle-mounted battery. For example, the related art discloses an example of a semiconductor device (drive circuit) used in a motor drive device.

However, a power supply voltage required for the control element and a power supply voltage required for the drive element may differ from each other. In such a case, in a semiconductor device in which a plurality of semiconductor elements are mounted in one package, since there is a difference in applied power supply voltage between two conduction paths, that is, a conduction path to the control element and a conduction path to the drive element, it is required to improve an insulation withstand voltage between these conduction paths.

SUMMARY

Some embodiments of the present disclosure provide a semiconductor device capable of improving an insulation withstand voltage.

According to one embodiment of the present disclosure, there is provided a semiconductor device including: a conductive support including a first die pad and a second die pad having a potential different from a potential of the first die pad; a first semiconductor element mounted on the first die pad; a second semiconductor element mounted on the second die pad; and a sealing resin that covers the first semiconductor element, the second semiconductor element, and at least a portion of the conductive support, wherein the first semiconductor element includes: a control part constituting an input-side circuit together with the first die pad; and a low-voltage drive part constituting a low-voltage output-side circuit that transmits and receives a signal to and from the input-side circuit, wherein the second semiconductor element includes a high-voltage drive part constituting a high-voltage output-side circuit, which transmits and receives a signal to and from the input-side circuit, together with the second die pad, wherein the conductive support further includes: a plurality of input-side terminals arranged along a first direction orthogonal to a thickness direction, at least one of the plurality of input-side terminals being electrically connected to the input-side circuit; a plurality of high-voltage output-side terminals arranged along the first direction, at least one of the plurality of high-voltage output-side terminals being electrically connected to the high-voltage output-side circuit; and a plurality of low-voltage output-side terminals arranged along the first direction on one side of the first direction with respect to the plurality of high-voltage output-side terminals, at least one of the plurality of low-voltage output-side terminals being electrically connected to the low-voltage output-side circuit, wherein the sealing resin has: a first side surface located on a first side in a second direction orthogonal to the thickness direction and the first direction, the plurality of input-side terminals protruding from the first side surface; a second side surface located on a second side in the second direction, the plurality of high-voltage output-side terminals and the plurality of low-voltage output-side terminals protruding from the second side surface; a third side surface located on a first side in the first direction and connected to the first side surface and the second side surface; and a fourth side surface located on a second side of the first direction and connected to the first side surface and the second side surface, and wherein the conductive support is not exposed from the fourth side surface.

Other features and advantages of the present disclosure will become more apparent with the detailed description given below with reference to the accompanying drawings.

DETAILED DESCRIPTION

Figure 1:
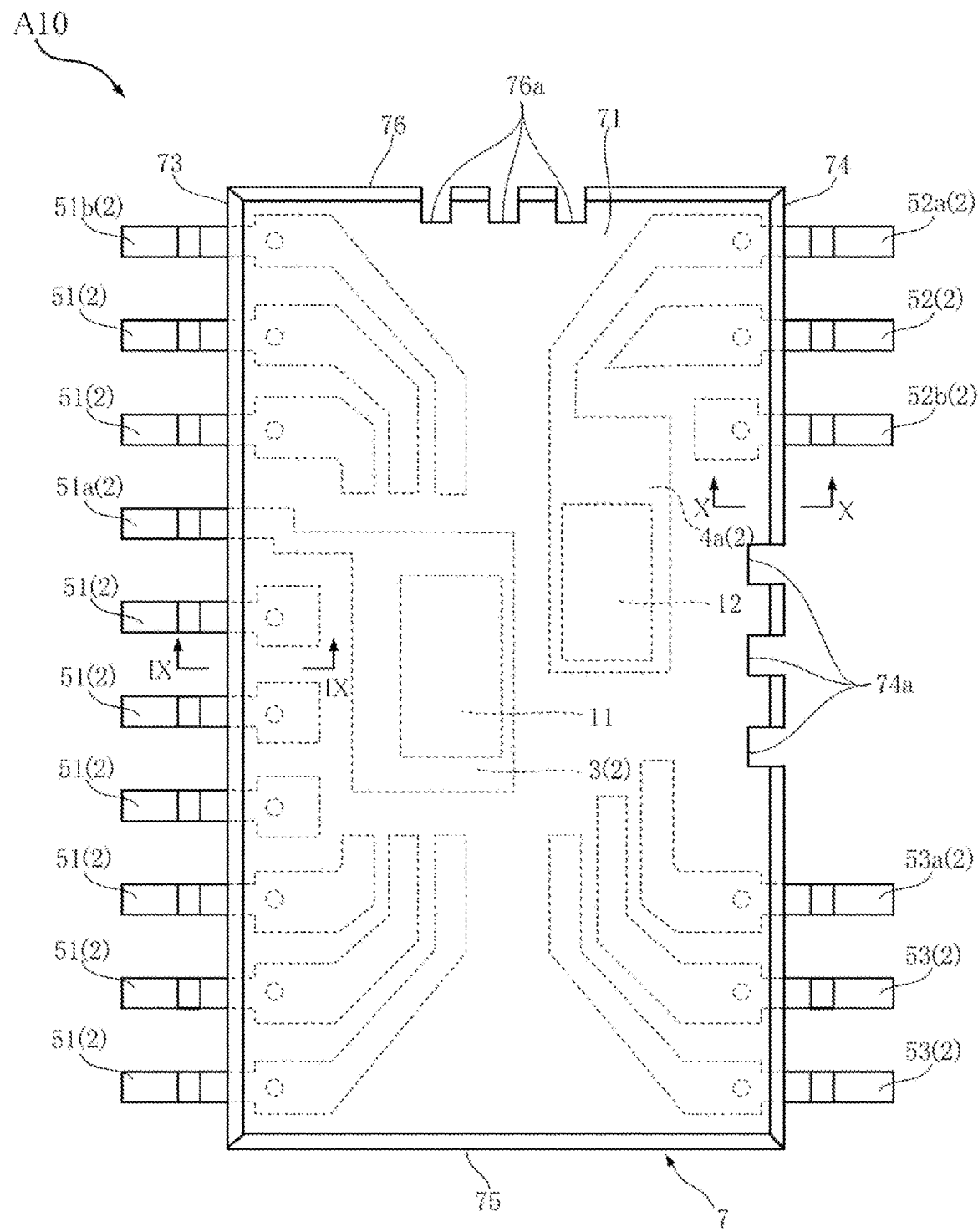
FIG. 1 is a plane view of a semiconductor device according to a first embodiment of the present disclosure.

Embodiments suitable for the present disclosure are described below in detail with reference to the accompanying drawings.

In the present disclosure, the phrases "a certain thing A is formed at another certain thing B" and "a certain thing A is formed on another certain thing B" include, unless otherwise specified, a case where "there is no thing between a certain A and another certain thing B" and a case where "there is another thing interposed between a certain thing A and another certain thing B." Similarly, the phrases "a certain thing A is placed at another certain thing B" and "a certain thing A is placed on another certain thing B" include, unless otherwise specified, a case where "there is no thing between a certain thing A and another certain thing B" and a case where "there is another thing interposed between a certain thing A another certain thing B." Similarly, the phrase "a certain thing A is located on another certain thing B" includes, unless otherwise specified, a case where "there is no thing between certain A and another certain thing B for the certain thing A to be in contact with the certain thing B" and a case where "there is another thing interposed between a certain thing A and another certain thing B." In addition, the phrase "a certain thing A overlaps with another certain thing B when viewed in a certain direction" includes, unless otherwise specified, a case where "a certain thing A entirely overlaps entirely with another certain thing B" and a case where "a certain thing A partially overlaps with another certain thing B."

First Embodiment

FIGS. 1 to 10 show an example of a semiconductor device according to a first embodiment of the present disclosure. The semiconductor device A10 according to the first embodiment includes a first semiconductor element 11, a second semiconductor element 12, a conductive support 2, a plurality of wires 61, a plurality of wires 62, a plurality of wires 63, a plurality of wires 64, and a sealing resin 7. The conductive support 2 includes a first die pad 3, a second die pad 4, a plurality of input-side terminals 51, a plurality of high-voltage output-side terminals 52, and a plurality of low-voltage output-side terminals 53. The semiconductor device A10 may be surface-mounted on a wiring board of an inverter device of an electric vehicle or a hybrid vehicle. The uses and functions of the semiconductor device A10 are not limited. The package type of the semiconductor device A10 is SOP (Small Outline Package). However, the package type of the semiconductor device A10 is not limited to SOP.

Figure 2:
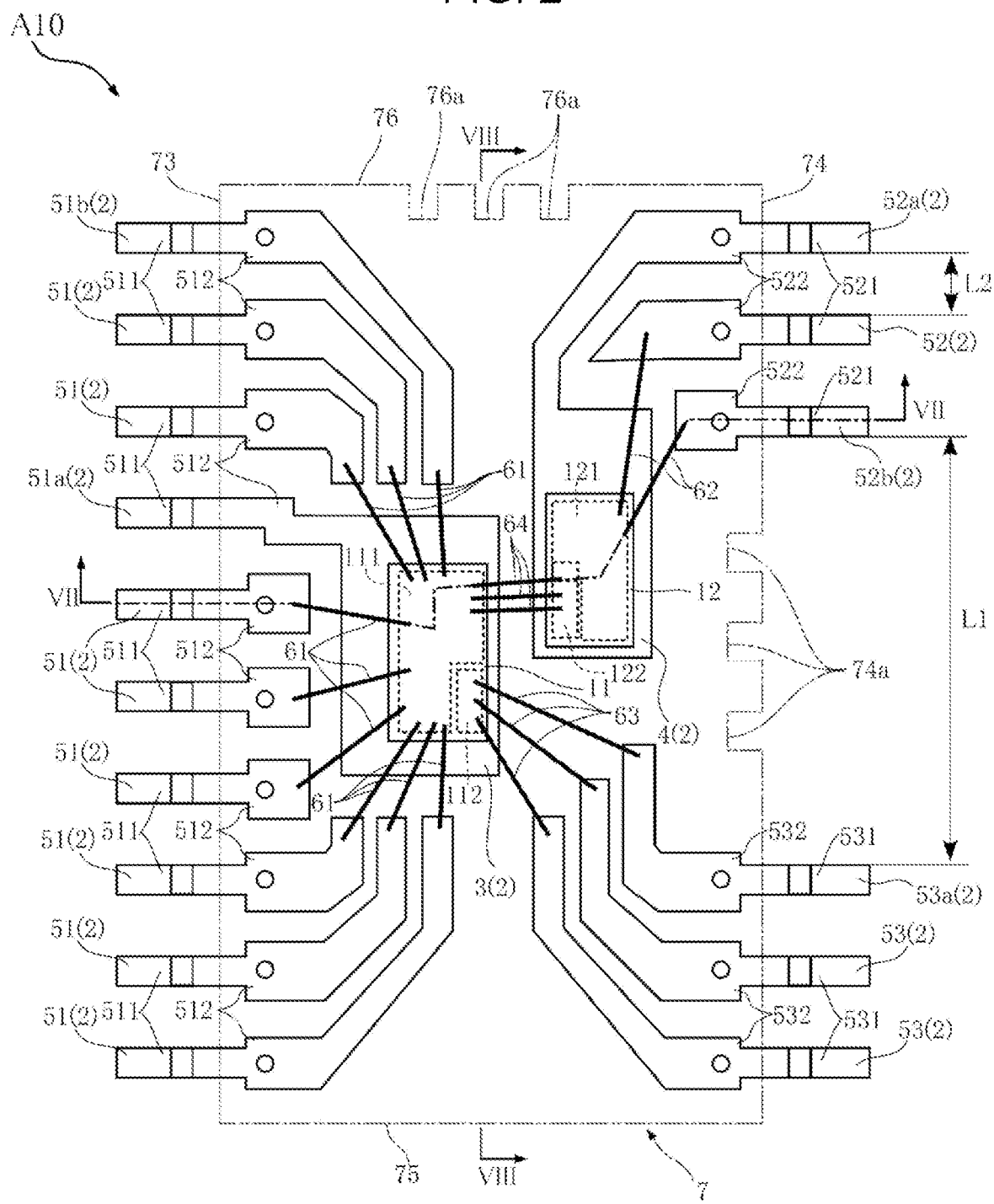
FIG. 2 is a plane view showing the semiconductor device of FIG. 1, which is a figure showing through a sealing resin.
Figure 3:
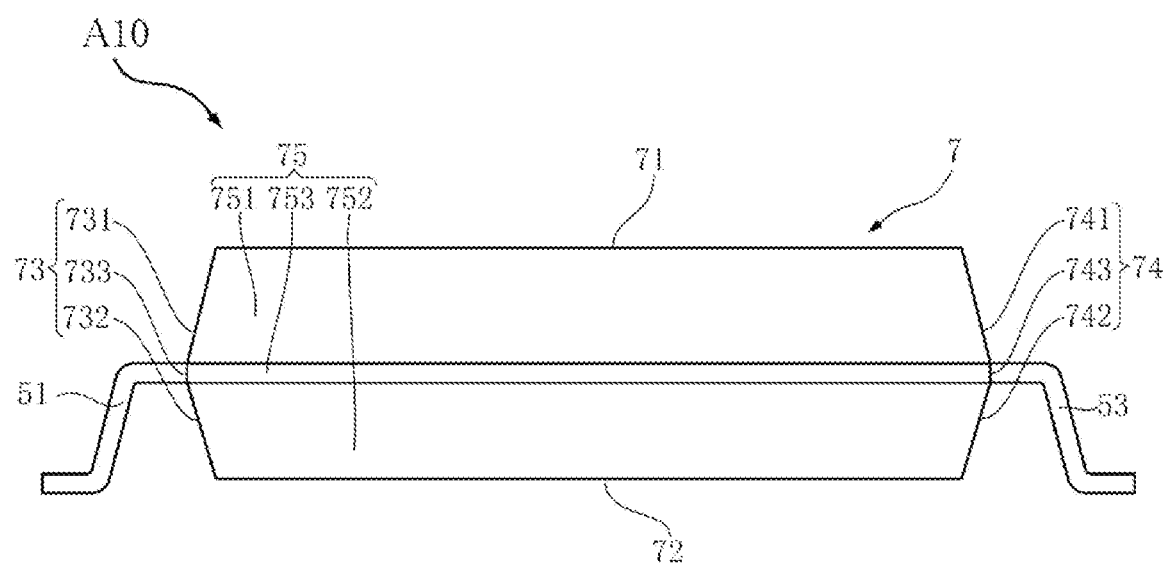
FIG. 3 is a front view showing the semiconductor device of FIG. 1.
Figure 3:
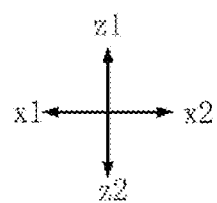
Figure 4:
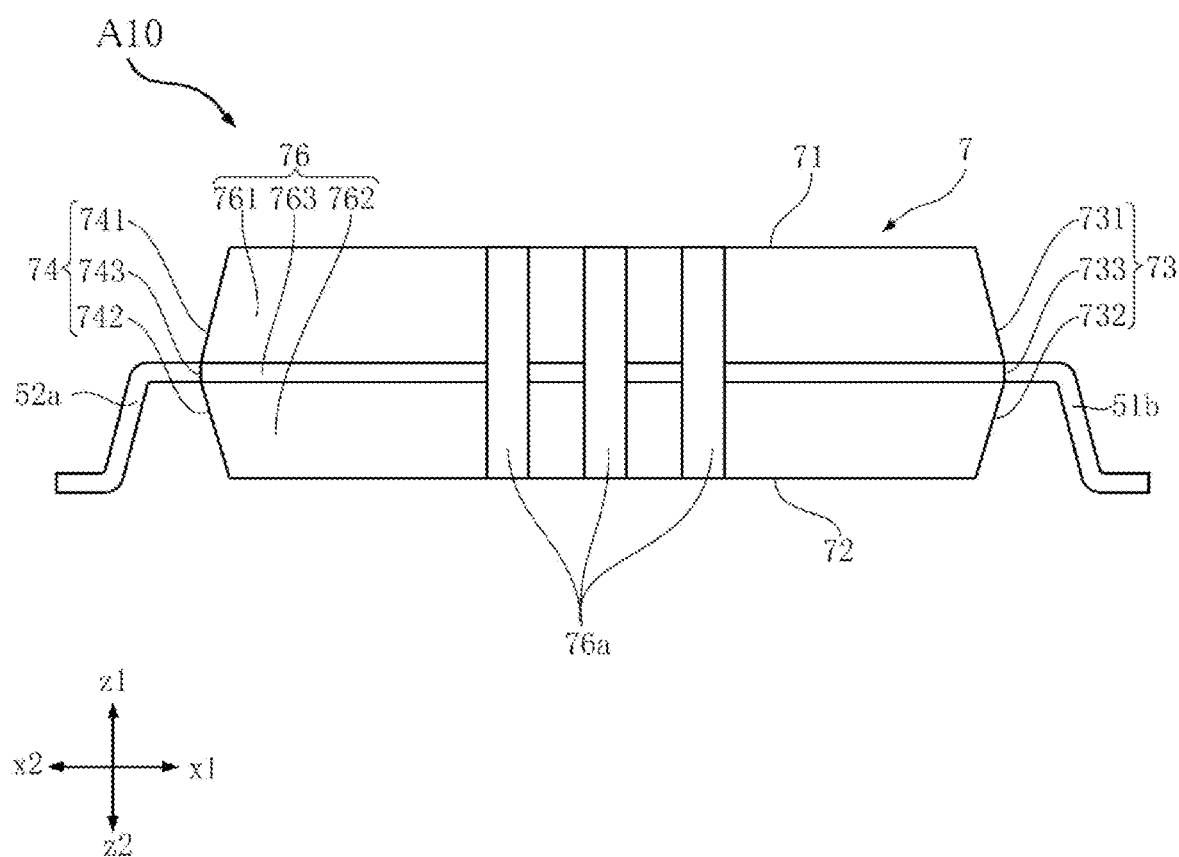
FIG. 4 is a rear view showing the semiconductor device of FIG. 1.
Figure 5:
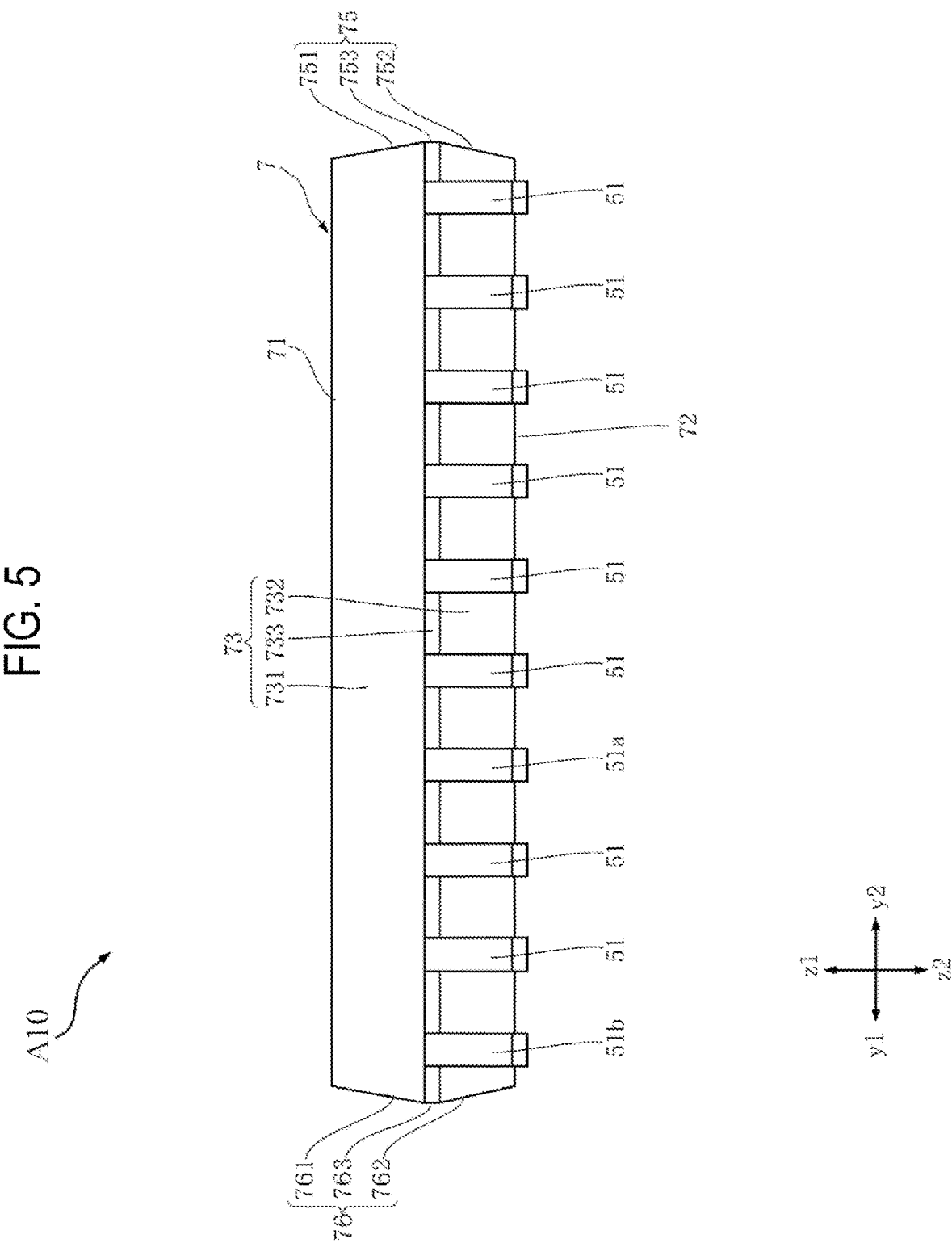
FIG. 5 is a left side view showing the semiconductor device of FIG. 1.
Figure 6:
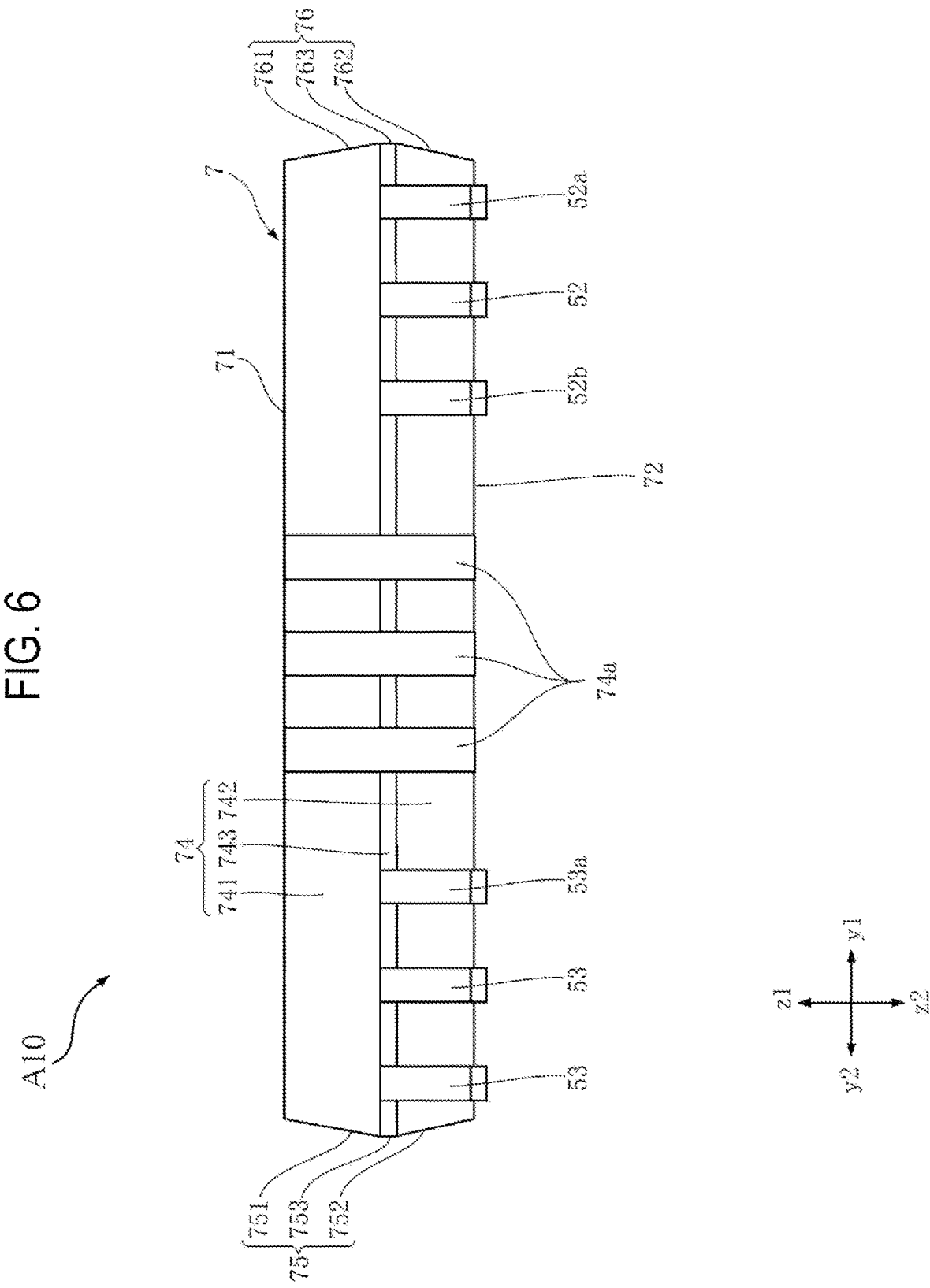
FIG. 6 is a right side view showing the semiconductor device of FIG. 1.
Figure 7:
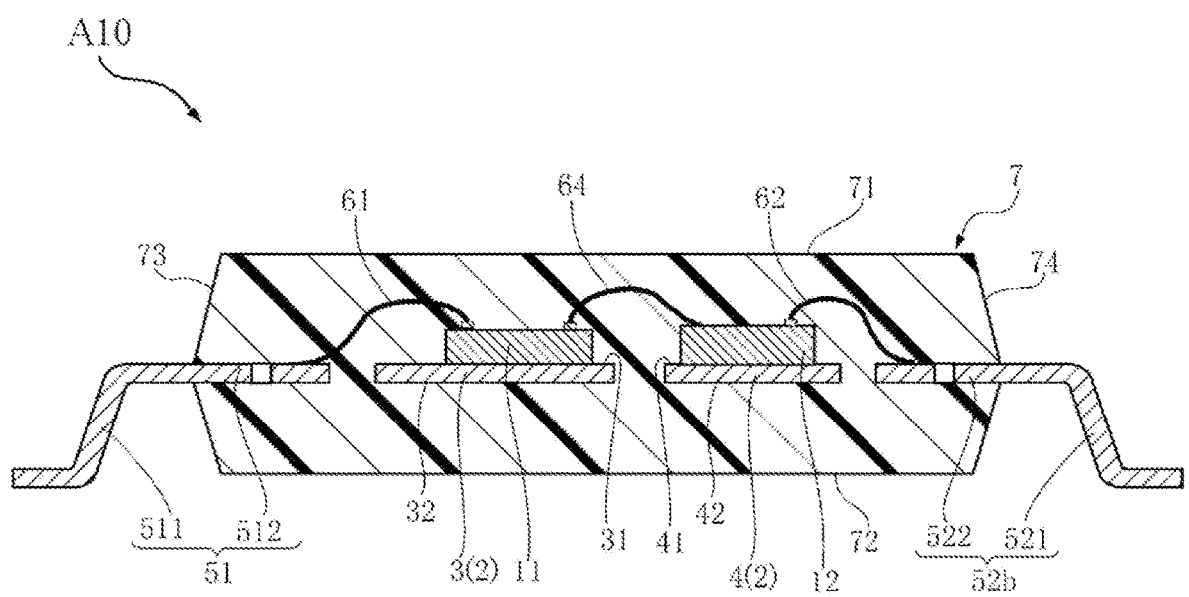
FIG. 7 is a cross-sectional view taken along line VII-VII of FIG. 2.
Figure 7:
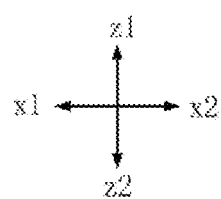
Figure 8:
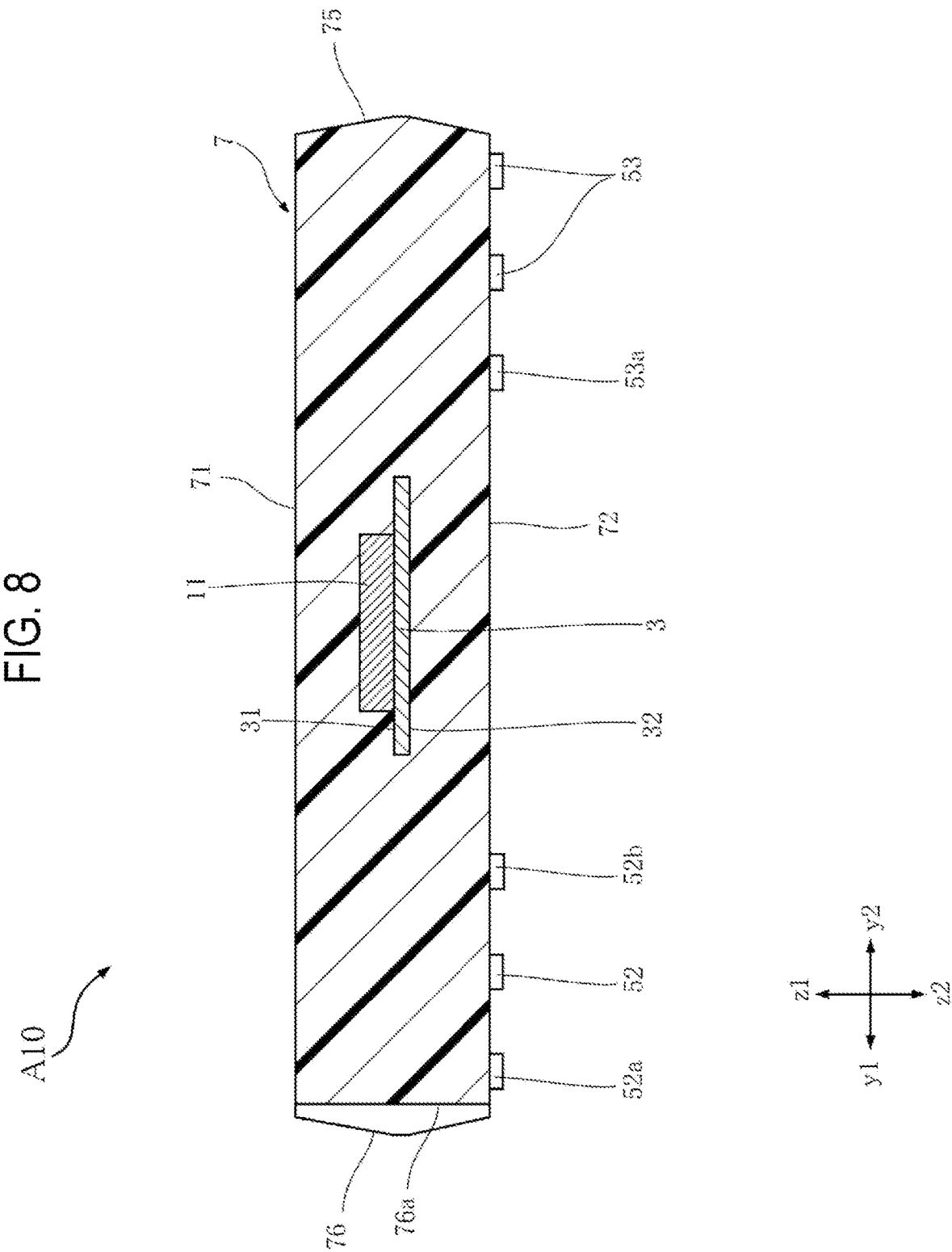
FIG. 8 is a cross-sectional view taken along line VIII-VIII of FIG. 2.
Figure 9:
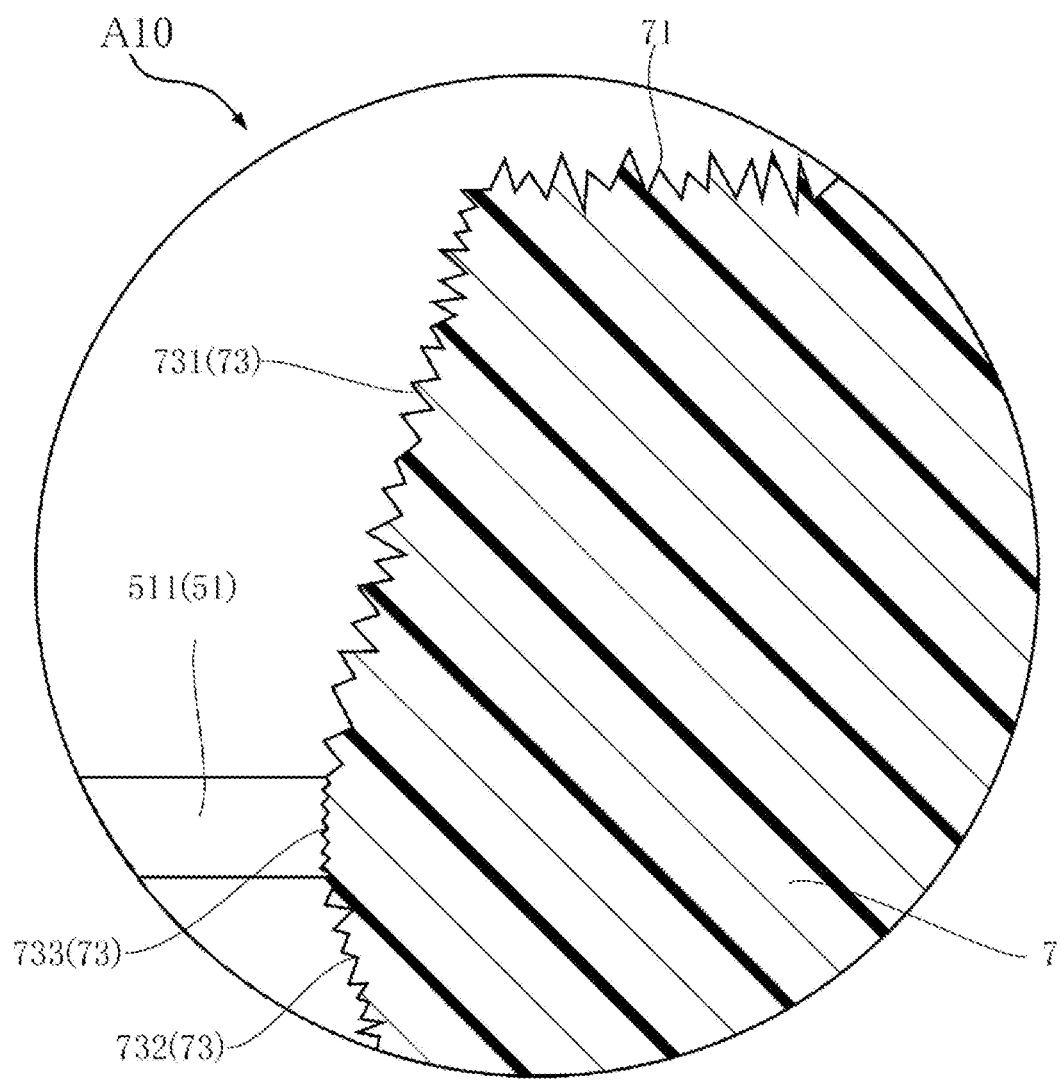
FIG. 9 is a cross-sectional view taken along line IX-IX of FIG. 1.
Figure 9:
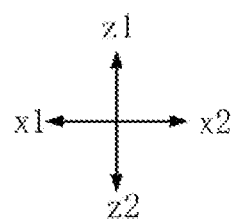
Figure 10:
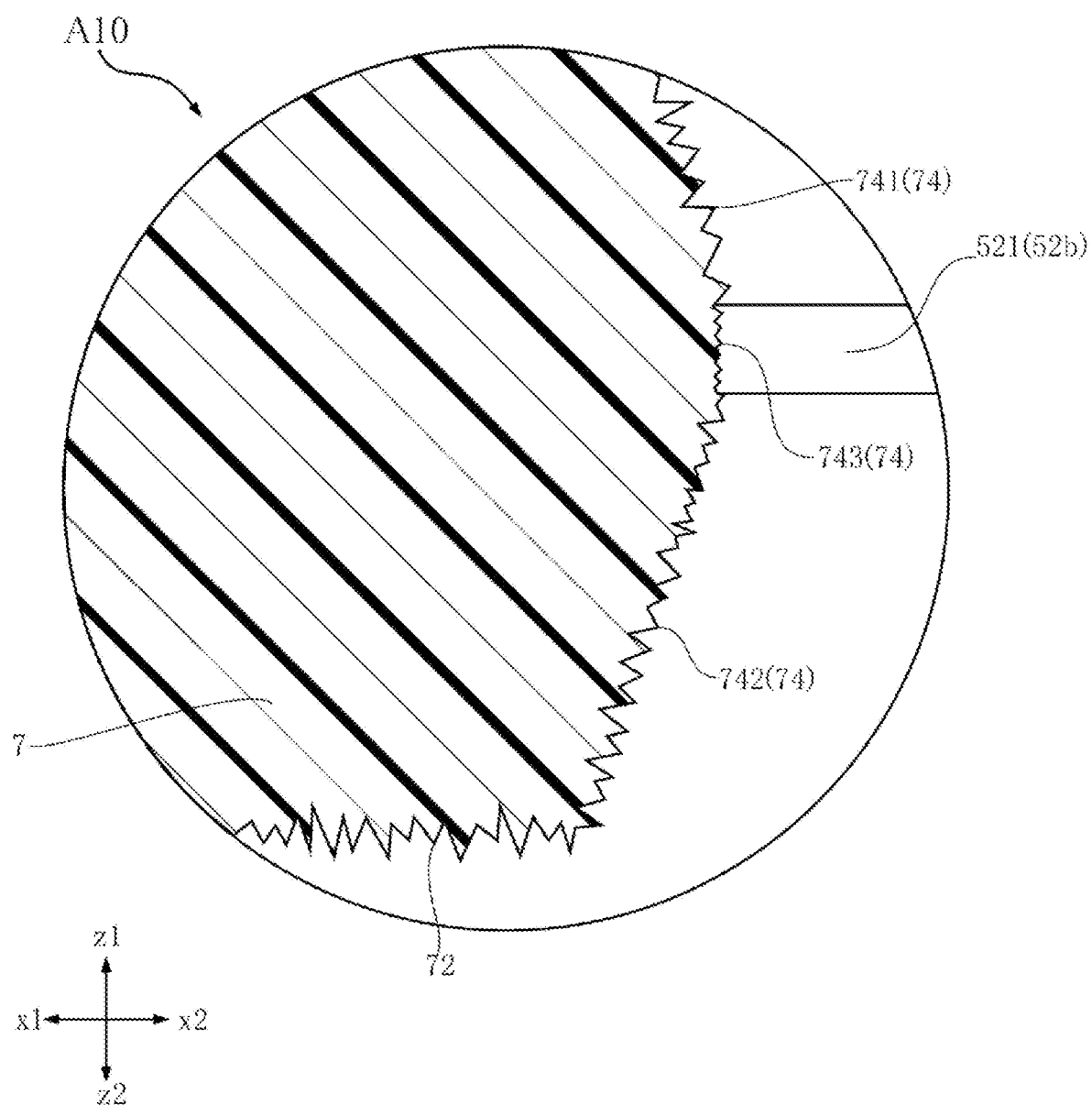
FIG. 10 is a cross-sectional view taken along line X-X of FIG. 1.

FIG. 1 is a plane view showing the semiconductor device A10. FIG. 2 is a plane view showing the semiconductor device A10. For convenience of understanding, FIG. 2 is illustrated through the sealing resin 7 with an outer shape of a sealing resin 7 shown by an imaginary line (two-dot chain line). FIG. 3 is a front view showing the semiconductor device A10. FIG. 4 is a rear view showing the semiconductor device A10. FIG. 5 is a left side view showing the semiconductor device A10. FIG. 6 is a right side view showing the semiconductor device A10. FIG. 7 is a cross-sectional view taken along line VII-VII of FIG. 2. FIG. 8 is a cross-sectional view taken along line VIII-VIII of FIG. 2. FIG. 9 is a cross-sectional view taken along line IX-IX of FIG. 1. FIG. 10 is a cross-sectional view taken along line X-X of FIG. 1.

The semiconductor device A10 has a long rectangular shape in the view of thickness direction (in a plane view). For convenience of explanation, the thickness direction (plane view direction) of the semiconductor device A10 is defined as a z direction; a direction (left-right direction in FIGS. 1 and 2) along one side of the semiconductor device A10, which is orthogonal to the z direction, is defined as an x direction; and a direction (up-down direction in FIGS. 1 and 2) orthogonal to the z direction and the x direction is defined as a y direction. Further, one side (upper side in FIGS. 3 to 8) in the z direction is defined as a z1 side, and the other side (lower side in FIGS. 3 to 8) is defined as a z2 side. One side (left side in FIGS. 1 and 2) in the x direction is defined as an x1 side, and the other side (right side in FIGS. 1 and 2) is defined as an x2 side. One side (upper side in FIGS. 1 and 2) in the y direction is defined as a y1 side, and the other side (lower side in FIGS. 1 and 2) is defined as a y2 side. The z direction corresponds to the "thickness direction" in the present disclosure, the y direction corresponds to a "first direction" in the present disclosure, and the x direction corresponds to a "second direction" in the present disclosure. The shape and dimensions of the semiconductor device A10 are not limited.

The first semiconductor element 11 and the second semiconductor element 12 are elements that perform as main functions of the semiconductor device A10.

As shown in FIG. 2, the first semiconductor element 11 is mounted on a portion (the first die pad 3 to be described later) of the conductive support 2, and is placed at a center of the semiconductor device A10 in the y direction and closer to x1 than a center of the semiconductor device A10 in the x direction. The first semiconductor element 11 has a rectangular shape that is long in the y direction when viewed in the z direction. The first semiconductor element 11 has a substrate (not shown) made of Si, and as shown in FIG. 2, a control part 111 and a low-voltage drive part 112 are formed on the substrate.

The control part 111 includes a circuit that converts a control signal input from an ECU or the like into a PWM control signal, and a transmitting circuit for transmitting the PWM control signal to the second semiconductor element 12 and the low-voltage drive part 112. In the present embodiment, the control part 111 receives a high-side control signal and a low-side control signal, transmits a high-side PWM control signal to the second semiconductor element 12, and transmits a low-side PWM control signal to the low-voltage drive part 112.

The low-voltage drive part 112 is placed closer to the x2 side of the first semiconductor element 11 in the x direction and closer to the y2 side of the first semiconductor element 11 in the y direction, and is electrically connected to the control part 111 in the first semiconductor element 11. The low-voltage drive part 112 has a circuit (gate driver) that receives the PWM control signal from the control part 111 and performs a switching operation of a switching element (for example, an IGBT, a MOSFET, etc.) based on the received PWM control signal. The low-voltage drive part 112 drives a low-side switching element.

As shown in FIG. 2, the second semiconductor element 12 is mounted on a portion (the second die pad 4 to be described later) of the conductive support 2 and is placed on the x2 side of the first semiconductor element 11 in the x direction. The second semiconductor element 12 has a rectangular shape that is long in the y direction when viewed in the z direction. The second semiconductor element 12 has a substrate (not shown) made of Si, and as shown in FIG. 2, a high-voltage drive part 121 and an insulating part 122 are formed on the substrate.

The high-voltage drive part 121 has a circuit (gate driver) that receives the PWM control signal from the control part 111 via the insulating part 122 and performs a switching operation of a switching element (for example, an IGBT, a MOSFET, etc.) based on the received PWM control signal. The high-voltage drive part 121 drives a high-side switching element.

The insulating part 122 is placed closer to the x1 side of the second semiconductor element 12 in the x direction and closer to the y2 side of the second semiconductor element 12 in the y direction, and is electrically connected to the high-voltage drive part 121 inside the second semiconductor element 12. The insulating part 122 is a part for transmitting the PWM control signal in an insulated state. The insulating part 122 receives the PWM control signal from the control part 111 of the first semiconductor element 11 via the wires 64 to be described later, and transmits the received PWM control signal to the high-voltage drive part 121 in an insulated state. That is, the insulating part 122 relays transmission and reception of a signal between the control part 111 of the first semiconductor element 11 and the high-voltage drive part 121 of the second semiconductor element 12, and insulates the control part 111 of the first semiconductor element 11 and the high-voltage drive part 121 of the second semiconductor element 12 from each other. The insulating part 122 is, for example, of an inductive type. In the present embodiment, the insulating part 122 is an insulated transformer that transmits an electric signal in an insulated state by inductively coupling a plurality of inductors (coils) made of, for example, Cu which are formed on the substrate. The plurality of inductors include a transmitting-side inductor and a receiving-side inductor and these inductors are laminated with each other in the thickness direction (z direction) of the second semiconductor element 12. A dielectric layer made of $SiO_2$ or the like is interposed between the transmitting-side inductor and the receiving-side inductor. The transmitting-side inductor and the receiving-side inductor are electrically isolated from each other by the dielectric layer. In the present embodiment, the insulating part 122 shows a case where it is of an inductive type, but it may be of a capacitive type. An insulating element of the capacitive type is, for example, a capacitor.

The second semiconductor element 12 receives the PWM control signal, which is transmitted from the first semiconductor element 11, via the insulating part 122. The first semiconductor element 11 may also transmit a signal other than the PWM control signal to the second semiconductor element 12. Further, the second semiconductor element 12 may transmit a signal such as a detection signal to the first semiconductor element 11.

A half-bridge circuit in which a low-side switching element and a high-side switching element are connected in a totem pole shape is generally used for a motor driver circuit in an inverter of a hybrid vehicle or the like. In an insulated gate driver, a switch that turns on at a certain point of time is only one of either the low-side switching element or the high-side switching element. In a high-voltage region, since a source of the low-side switching element and a reference potential of the insulated gate driver that drives the switching element are connected to the ground, a gate-source voltage operates with reference to the ground. On the other hand, a source of the high-side switching element and a reference potential of the insulated gate driver that drives the switching element are connected to an output node of the half-bridge circuit. Since a potential of the output node of the half-bridge circuit changes depending on whether the low-side switching element or the high-side switching element is turned on, the reference potential of the insulated gate driver that drives the high-side switching element changes. When the high-side switching element is turned on, the reference potential becomes a voltage (for example, 600V or higher) equivalent to a voltage applied to a drain of the high-side switching element. In the semiconductor device A10, the high-voltage drive part 121 of the second semiconductor element 12 is used as an insulated gate driver for driving the high-side switching element. Since the high-voltage drive part 121 of the second semiconductor element 12 and the control part 111 of the first semiconductor element 11 are separated from each other in order to ensure insulation, a voltage equal to or higher than 600V is transiently applied to the high-voltage drive part 121 as compared with the ground of the control part 111. Since a significant potential difference occurs between the control part 111 of the first semiconductor element 11 and the high-voltage drive part 121 of the second semiconductor element 12, in the semiconductor device A10, an input-side circuit including the control part 111 of the first semiconductor element 11 and a high-voltage output-side circuit including the high-voltage drive part 121 of the second semiconductor element 12 are insulated by the insulating part 122 of the second semiconductor element 12. That is, the insulating part 122 of the second semiconductor element 12 insulates the input-side circuit having a relatively low potential and the high-voltage output-side circuit having a relatively high potential. In the present embodiment, since a potential difference between the low-voltage drive part 112 and the control part 111 of the first semiconductor element 11 is small, the input-side circuit and a low-voltage output-side circuit including the low-voltage drive part 112 of the first semiconductor element 11 is not insulated between them.

A plurality of electrodes (not shown) are provided on an upper surface (a surface facing the z1 side) of the first semiconductor element 11. Further, a back surface electrode (not shown) is provided on a lower surface (a surface facing the z2 side) of the first semiconductor element 11. These electrodes are electrically connected to a circuit implemented in the first semiconductor element 11. Similarly, a plurality of electrodes (not shown) are provided on an upper surface (a surface facing the z1 side) of the second semiconductor element 12. Further, a back surface electrode (not shown) is provided on a lower surface (a surface facing the z2 side) of the second semiconductor element 12. These electrodes are electrically connected to a circuit implemented in the second semiconductor element 12.

The conductive support 2 is a member that constitutes a conduction path between the wiring board of an inverter device and the first semiconductor element 11 and the second semiconductor element 12, in the semiconductor device A10. The conductive support 2 is made of, for example, an alloy containing Cu in its composition. The conductive support 2 is formed from a lead frame 81 which will be described later. The conductive support 2 mounts the first semiconductor element 11 and the second semiconductor element 12. As shown in FIG. 2, the conductive support 2 includes the first die pad 3, the second die pad 4, the plurality of input-side terminals 51, the high-voltage output-side terminals 52, and the plurality of low-voltage output-side terminals 53.

The first die pad 3 is arranged closer to x1 than the center of the semiconductor device A10 in the x direction, at the center of the semiconductor device A10 in the y direction. The second die pad 4 is arranged on the x2 side in the x direction with respect to the first die pad 3 away from the first die pad 3.

As shown in FIGS. 2, 7, and 8, the first semiconductor element 11 is mounted on the first die pad 3. The first die pad 3 is electrically connected to the back surface electrode of the first semiconductor element 11 and is an element of the above-mentioned input-side circuit. The first die pad 3 has, for example, substantially a rectangular shape when viewed in the z direction. The first die pad 3 has a first main surface 31 and a first back surface 32. The first main surface 31 and the first back surface 32 are separated from each other in the z direction, as shown in FIGS. 7 and 8. The first main surface 31 faces the z1 side, and the first back surface 32 faces the z2 side. The first main surface 31 and the first back surface 32 are each substantially flat. The first semiconductor element 11 is bonded to the first main surface 31 by a conductive bonding material (solder, metal paste, sintered metal, etc.) (not shown).

As shown in FIGS. 2 and 7, the second semiconductor element 12 is mounted on the second die pad 4. The second die pad 4 is electrically connected to the back surface electrode of the second semiconductor element 12 and is an element of the above-mentioned high-voltage output-side circuit. The second die pad 4 has, for example, substantially a rectangular shape when viewed in the z direction. The second die pad 4 has a second main surface 41 and a second back surface 42. As shown in FIG. 7, the second main surface 41 and the second back surface 42 are separated from each other in the z direction. The second main surface 41 faces the z1 side, and the second back surface 42 faces the z2 side. The second main surface 41 and the second back surface 42 are each substantially flat. The second semiconductor element 12 is bonded to the second main surface 41 of the second die pad 4 by a conductive bonding material (not shown).

The plurality of input-side terminals 51 are members that form a conduction path between the semiconductor device A10 and a wiring board of an inverter device by being bonded to the wiring board. Each of the input-side terminals 51 is appropriately electrically connected to the control part 111 of the first semiconductor element 11 and is an element of the above-mentioned input-side circuit. As shown in FIGS. 1, 2, and 5, the plurality of input-side terminals 51 are arranged along the y direction while being separated from each other. Any of the plurality of input-side terminals 51 is located on the x1 side with respect to the first die pad 3 in the x direction and protrudes from the sealing resin 7 (a first side surface 73 to be described later) to the x1 side in the x direction. The plurality of input-side terminals 51 include a power supply terminal to which a voltage is supplied, a ground terminal, input terminals into which two types of control input signals are respectively input, input terminals into which other control signals are input, and the like. In the present embodiment, the semiconductor device A10 includes 10 input-side terminals 51. The number of input-side terminals 51 is not limited. Each of the input-side terminals 51 includes a lead part 511 and a pad part 512.

The lead part 511 is an elongated rectangular portion extending along the x direction. The lead part 511 includes a portion exposed from the sealing resin 7 and a portion covered with the sealing resin 7. As shown in FIG. 7, the portion of the lead part 511 exposed from the sealing resin 7 is bent in a gull wing shape. Further, the portion of the lead part 511 exposed from the sealing resin 7 may be plated. A plating layer formed by plating treatment is made of an alloy containing Sn, such as solder, and covers the portion exposed from the sealing resin 7. As the semiconductor device A10 is surface-mounted on the wiring board of the inverter device by solder bonding, the plating layer prevents erosion of the exposed portion due to the solder bonding while improving the adhesion of solder to the exposed portion. The lead parts 511 of the plurality of input-side terminals 51 are arranged at equal intervals along the y direction while being separated from each other.

The pad part 512 is a portion connected to the x2 side of the lead part 511 in the x direction. The shape of each pad part 512 when viewed in the z direction is not limited, but the pad parts 512 approach the first die pad 3 and are spaced apart from each other by a predetermined distance or more. An upper surface (a surface facing the z1 side) of the pad part 512 may be plated. A plating layer formed by plating treatment is made of, for example, a metal containing Ag, and covers the upper surface of the pad part 512. The plating layer protects the lead frame 81 (which will be described later) from an impact of wire bonding of the wires 61 (which will be described later) while increasing bonding strength of the wires 61. The pad part 512 is covered with the sealing resin 7 over the entire surface. The pad part 512 is substantially flat.

The plurality of input-side terminals 51 include an input-side terminal 51a and an input-side terminal 51b. As shown in FIG. 2, the input-side terminal 51a is arranged fourth from the y1 side in the y direction among the plurality of input-side terminals 51. The input-side terminal 51a is connected, by the pad part 512, to a position (closer to the y1 side in the y direction) of an end portion (which is on the x1 side in the x direction) of the first die pad 3. As a result, the input-side terminal 51a supports the first die pad 3. The pad parts 512 of the input-side terminals 51 other than the input-side terminal 51a are wider than the lead part 511 in the y direction, and the wires 61 are bonded to the pad parts 512. As shown in FIG. 2, the input-side terminal 51b is arranged on an uppermost y1 side in the y direction among the plurality of input-side terminals 51. A shape of each of the input-side terminals 51 is not limited.

Like the plurality of input-side terminals 51, the plurality of high-voltage output-side terminals 52 are members that form a conduction path between the semiconductor device A10 and the wiring board of the inverter device by being bonded to the wiring board. Each of the high-voltage output-side terminals 52 is appropriately electrically connected to the second semiconductor element 12 and is an element of the above-mentioned high-voltage output-side circuit. As shown in FIGS. 1, 2 and 6, the plurality of high-voltage output-side terminals 52 are arranged along the y direction while being separated from each other. Any of the plurality of high-voltage output-side terminals 52 is located on the x2 side of the second die pad 4 in the x direction and protrudes from the sealing resin 7 (a second side surface 74 to be described later) to the x2 side in the x direction. The plurality of high-voltage output-side terminals 52 include a power supply terminal to which a voltage is supplied, a ground terminal, a high-side output terminal, and the like. In the present embodiment, the semiconductor device A10 includes three high-voltage output-side terminals 52. The number of high-voltage output-side terminals 52 is not limited. Each of the high-voltage output-side terminals 52 includes a lead part 521 and a pad part 522.

The lead part 521 is an elongated rectangular portion extending along the x direction. The lead part 521 includes a portion exposed from the sealing resin 7 and a portion covered with the sealing resin 7. As shown in FIG. 7, the portion of the lead part 521 exposed from the sealing resin 7 is bent in a gull wing shape. Further, a plating layer (for example, an alloy containing Sn such as solder) may be formed on the portion of the lead part 521 exposed from the sealing resin 7, as in the lead part 511. The lead parts 521 of the plurality of high-voltage output-side terminals 52 are arranged at equal intervals along the y direction while being separated from each other.

The pad part 522 is connected to the x1 side of the lead part 521 in the x direction and is wider than the lead part 521 in the y direction. The shape of each pad part 522 when viewed in the z direction is not limited, but the pad parts 522 approach the second die pad 4 and are spaced apart from each other by a predetermined distance. The upper surface (the surface facing the z1 side) of the pad part 522 may be covered with a plating layer (for example, a metal containing Ag), similarly to the upper surface of the pad part 512. The pad part 522 is covered with the sealing resin 7 over the entire surface. The pad part 522 is substantially flat.

The plurality of high-voltage output-side terminals 52 include a high-voltage output-side terminal 52a and a high-voltage output-side terminal 52b. As shown in FIG. 2, the high-voltage output-side terminal 52a is arranged on an uppermost y1 side in the y direction among the plurality of high-voltage output-side terminals 52. The high-voltage output-side terminal 52a is connected, by a pad part 522, to a position (which is closer to the x1 side in the x direction) of an end portion (which is on the y1 side in the y direction) of the second die pad 4, and supports the second die pad 4. The high-voltage output-side terminal 52a corresponds to a "support terminal" of the present disclosure. The wires 62 are bonded to the pad parts 522 of the high-voltage output-side terminals 52 other than the high-voltage output-side terminal 52a. As shown in FIG. 2, the high-voltage output-side terminal 52b is arranged on an uppermost y2 side in the y direction among the plurality of high-voltage output-side terminals 52. The high-voltage output-side terminal 52b corresponds to an "inner high-voltage output-side terminal" of the present disclosure. The shape of each of the high-voltage output-side terminals 52 is not limited.

Like the plurality of input-side terminals 51, the plurality of low-voltage output-side terminals 53 are members that form a conduction path between the semiconductor device A10 and the wiring board of the inverter device by being bonded to the wiring board. Each of the low-voltage output-side terminal 53 is appropriately electrically connected to the low-voltage drive part 112 of the first semiconductor element 11 and is an element of the above-mentioned low-voltage output-side circuit. As shown in FIGS. 1, 2, and 6, the plurality of low-voltage output-side terminals 53 are arranged along the y direction while being separated from each other. Any of the plurality of low-voltage output-side terminals 53 are all located on the x2 side of the first die pad 3 in the x direction and protrude from the sealing resin 7 (the second side surface 74 to be described later) to the x2 side in the x direction. Further, the plurality of low-voltage output-side terminals 53 are arranged on the y2 side of the plurality of high-voltage output-side terminals 52 in the y direction. The plurality of low-voltage output-side terminals 53 include a power supply terminal to which a voltage is supplied, a ground terminal, a low-side output terminal, and the like. In the present embodiment, the semiconductor device A10 includes three low-voltage output-side terminals 53. The number of low-voltage output-side terminals 53 is not limited. Each of the low-voltage output-side terminals 53 includes a lead part 531 and a pad part 532.

The lead part 531 is an elongated rectangular portion extending along the x direction. The lead part 531 includes a portion exposed from the sealing resin 7 and a portion covered with the sealing resin 7. As shown in FIG. 3, the portion of the lead part 531 exposed from the sealing resin 7 is bent in a gull wing shape. Further, a plating layer (for example, an alloy containing Sn such as solder) may be formed on the portion of the lead part 531 exposed from the sealing resin 7, as in the lead part 511. The lead parts 531 of the plurality of low-voltage output-side terminals 53 are arranged at equal intervals along the y direction while being separated from each other.

The pad part 532 is connected to the x1 side of the lead part 531 in the x direction and is wider than the lead part 531 in the y direction. The shape of each pad part 532 when viewed in the z direction is not limited, but the pad parts 532 approach the first die pad 3 and are spaced apart from each other by a predetermined distance. The wires 63 are bonded to each pad part 522. An upper surface (a surface facing the z1 side) of the pad part 532 may be covered with a plating layer (for example, a metal containing Ag), similarly to the upper surface of the pad part 512. The pad part 532 is covered with the sealing resin 7 over the entire surface. The pad part 532 is substantially flat.

The plurality of low-voltage output-side terminals 53 include a low-voltage output-side terminal 53a. As shown in FIG. 2, the low-voltage output-side terminal 53a is arranged on an uppermost y1 side in the y direction among the plurality of low-voltage output-side terminals 53. The low-voltage output-side terminal 53a corresponds to an "inner low-voltage output-side terminal" of the present disclosure. The shape of each of the low-voltage output-side terminals 53 is not limited.

In the present embodiment, the lead parts 521 of the plurality of high-voltage output-side terminals 52 and the lead parts 531 of the plurality of low-voltage output-side terminals 53 are greatly separated in the y direction. Specifically, a first distance L1 between terminals, which is a distance between the lead part 521 of the high-voltage output-side terminal 52b and the lead part 531 of the low-voltage output-side terminal 53a, is large, which is about 7 times a second distance L2 between terminals, which is a distance between the lead parts 521 of two adjacent high-voltage output-side terminals 52. Further, the first distance L1 between terminals is not limited, but it may be 5 times or more the second distance L2 between terminals.

In the semiconductor device A10, a voltage equal to or higher than 600V is transiently applied to the high-voltage drive part 121 of the second semiconductor element 12 as compared with the ground of the control part 111 of the first semiconductor element 11. Therefore, a significant potential difference may occur between the high-voltage output-side terminal 52 electrically connected to the high-voltage drive part 121 and the input-side terminal 51 electrically connected to the control part 111. Further, since a potential difference between the low-voltage drive part 112 and the control part 111 of the first semiconductor element 11 is small, a significant potential difference may also occur between the high-voltage output-side terminal 52 electrically connected to the high-voltage drive part 121 and the low-voltage output-side terminal 53 electrically connected to the low-voltage drive part 112.

As shown in FIG. 2, the plurality of wires 61, the plurality of wires 62, the plurality of wires 63, and the plurality of wires 64 form conduction paths for the first semiconductor element 11 and the second semiconductor element 12 to perform predetermined functions, together with the conductive support 2. The material of each of the plurality of wires 61, the plurality of wires 62, the plurality of wires 63, and the plurality of wires 64 is metal including, for example, Au, Cu, or Al.

As shown in FIGS. 2 and 7, the plurality of wires 61 form a conduction path between the control part 111 of the first semiconductor element 11 and the plurality of input-side terminals 51. The control part 111 of the first semiconductor element 11 is electrically connected by the plurality of wires 61 to at least one of the plurality of input-side terminals 51. The plurality of wires 61 are one element of the above-mentioned input-side circuit. As shown in FIG. 2, each of the plurality of wires 61 is bonded to any electrode of the control part 111 of the first semiconductor element 11 and the pad part 512 of any of the input-side terminals 51.

As shown in FIGS. 2 and 7, the plurality of wires 62 form a conduction path between the high-voltage drive part 121 of the second semiconductor element 12 and the plurality of high-voltage output-side terminals 52. The high-voltage drive part 121 of the second semiconductor element 12 is electrically connected by the plurality of wires 62 to at least one of the plurality of high-voltage output-side terminals 52. The plurality of wires 62 are one element of the above-mentioned high-voltage output-side circuit. As shown in FIG. 2, each of the plurality of wires 62 is bonded to a certain electrode of the high-voltage drive part 121 of the second semiconductor element 12 and the pad part 522 of a certain one of the high-voltage output-side terminals 52.

As shown in FIG. 2, the plurality of wires 63 form a conduction path between the low-voltage drive part 112 of the first semiconductor element 11 and the plurality of low-voltage output-side terminals 53. The low-voltage drive part 112 of the first semiconductor element 11 is electrically connected by the plurality of wires 63 to at least one of the plurality of low-voltage output-side terminals 53. The plurality of wires 63 are one element of the above-mentioned low-voltage output-side circuit. As shown in FIG. 2, each of the plurality of wires 63 is bonded to a certain electrode of the low-voltage drive part 112 of the first semiconductor element 11 and the pad part 532 of a certain one of the low-voltage output-side terminals 53.

As shown in FIGS. 2 and 7, the plurality of wires 64 form a conduction path between the control part 111 of the first semiconductor element 11 and the insulating part 122 of the second semiconductor element 12. The control part 111 of the first semiconductor element 11 and the insulating part 122 of the second semiconductor element 12 are electrically connected to each other by the plurality of wires 64. The plurality of wires 64 are one element of the above-mentioned input-side circuit. As shown in FIG. 2, each of the plurality of wires 64 is bonded to a certain electrode of the control part 111 of the first semiconductor element 11 and a certain electrode of the insulating part 122 of the second semiconductor element 12.

As shown in FIG. 1, the sealing resin 7 covers the first semiconductor element 11, the second semiconductor element 12, the first die pad 3, the second die pad 4, the plurality of wires 61 to 64, and a portion of each of the plurality of input-side terminals 51, the plurality of high-voltage output-side terminals 52, and the plurality of low-voltage output-side terminals 53. The sealing resin 7 has electrical insulation. The sealing resin 7 is made of a material containing, for example, a black epoxy resin. When viewed in the z direction, the sealing resin 7 has a long rectangular shape in the y direction.

As shown in FIGS. 3 to 6, the sealing resin 7 has a top surface 71, a bottom surface 72, a first side surface 73, a second side surface 74, a third side surface 75, and a fourth side surface 76.

The top surface 71 and the bottom surface 72 are located apart from each other in the z direction. The top surface 71 and the bottom surface 72 face opposite to each other in the z direction. The top surface 71 is located on the z1 side in the z direction and faces the z1 side like the first main surface 31 of the first die pad 3. The bottom surface 72 is located on the z2 side in the z direction and faces the z2 side like the first back surface 32 of the first die pad 3. Each of the top surface 71 and the bottom surface 72 is substantially flat.

Each of the first side surface 73, the second side surface 74, the third side surface 75, and the fourth side surface 76 is connected to the top surface 71 and the bottom surface 72 and is sandwiched between the top surface 71 and the bottom surface 72 in the z direction. The first side surface 73 and the second side surface 74 are located apart from each other in the x direction. The first side surface 73 and the second side surface 74 face opposite to each other in the x direction. The first side surface 73 is located on the x1 side in the x direction, and the second side surface 74 is located on the x2 side in the x direction. The third side surface 75 and the fourth side surface 76 are located apart from each other in the y direction and are connected to the first side surface 73 and the second side surface 74. The third side surface 75 and the fourth side surface 76 face opposite to each other in the y direction. The third side surface 75 is located on the y2 side in the y direction, and the fourth side surface 76 is located on the y1 side in the y direction.

As shown in FIG. 1, a portion of each of the plurality of input-side terminals 51 protrudes from the first side surface 73. Further, a portion of each of the plurality of high-voltage output-side terminals 52 and the plurality of low-voltage output-side terminals 53 protrudes from the second side surface 74. The conductive support 2 is not exposed from the third side surface 75 and the fourth side surface 76. Further, on the second side surface 74, the conductive support 2 is not exposed between the high-voltage output-side terminal 52b and the low-voltage output-side terminal 53a.

As shown in FIGS. 3 to 5, the first side surface 73 includes a first region 731, a second region 732, and a third region 733. One end of the first region 731 in the z direction is connected to the top surface 71, and the other end thereof in the z direction is connected to the third region 733. The first region 731 is inclined with respect to the top surface 71. One end of the second region 732 in the z direction is connected to the bottom surface 72, and the other end thereof in the z direction is connected to the third region 733. The second region 732 is inclined with respect to the bottom surface 72. One end of the third region 733 in the z direction is connected to the first region 731, and the other end thereof in the z direction is connected to the second region 732. The third region 733 is along both the z direction and the y direction. When viewed the z direction, the third region 733 is located outside the top surface 71 and the bottom surface 72. A portion of each of the plurality of input-side terminals 51 is exposed from the third region 733.

As shown in FIGS. 3, 4, and 6, the second side surface 74 includes a fourth region 741, a fifth region 742, and a sixth region 743. One end of the fourth region 741 in the z direction is connected to the top surface 71, and the other end thereof in the z direction is connected to the sixth region 743. The fourth region 741 is inclined with respect to the top surface 71. One end of the fifth region 742 in the z direction is connected to the bottom surface 72, and the other end thereof in the z direction is connected to the sixth region 743. The fifth region 742 is inclined with respect to the bottom surface 72. One end of the sixth region 743 in the z direction is connected to the fourth region 741, and the other end thereof in the z direction is connected to the fifth region 742. The sixth region 743 is along both the z direction and the y direction. When viewed in the z direction, the sixth region 743 is located outside the top surface 71 and the bottom surface 72. A portion of each of the plurality of high-voltage output-side terminals 52 and the low-voltage output-side terminals 53 is exposed from the sixth region 743.

As shown in FIGS. 3, 5, and 6, the third side surface 75 includes a seventh region 751, an eighth region 752, and a ninth region 753. One end of the seventh region 751 in the z direction is connected to the top surface 71, and the other end thereof in the z direction is connected to the ninth region 753. The seventh region 751 is inclined with respect to the top surface 71. One end of the eighth region 752 in the z direction is connected to the bottom surface 72, and the other end thereof in the z direction is connected to the ninth region 753. The eighth region 752 is inclined with respect to the bottom surface 72. One end of the ninth region 753 in the z direction is connected to the seventh region 751, and the other end thereof in the z direction is connected to the eighth region 752. The ninth region 753 is along both the z direction and the y direction. When viewed in the z direction, the ninth region 753 is located outside the top surface 71 and the bottom surface 72.

As shown in FIGS. 4 to 6, the fourth side surface 76 includes a tenth region 761, an eleventh region 762, and a twelfth region 763. One end of the tenth region 761 in the z direction is connected to the top surface 71, and the other end thereof in the z direction is connected to the twelfth region 763. The tenth region 761 is inclined with respect to the top surface 71. One end of the eleventh region 762 in the z direction is connected to the bottom surface 72, and the other end thereof in the z direction is connected to the twelfth region 763. The eleventh region 762 is inclined with respect to the bottom surface 72. One end of the twelfth region 763 in the z direction is connected to the tenth region 761, and the other end thereof in the z direction is connected to the eleventh region 762. The twelfth region 763 is along both the z direction and the y direction. When viewed in the z direction, the twelfth region 763 is located outside the top surface 71 and the bottom surface 72.

In the present embodiment, as shown in FIGS. 9 and 10, a surface roughness of each of the top surface 71, the bottom surface 72, the first region 731 of the first side surface 73, and the second region 732 of the first side surface 73 of the sealing resin 7 is larger than a surface roughness of the third region 733 of the first side surface 73. Further, a surface roughness of each of the top surface 71, the bottom surface 72, the fourth region 741 of the second side surface 74, and the fifth region 742 of the second side surface 74 of the sealing resin 7 is larger than a surface roughness of the sixth region 743 of the second side surface 74. The surface roughness of each of the top surface 71 and the bottom surface 72 may be 5 μmRz or greater and 20 μmRz or smaller.

Further, in the present embodiment, the sealing resin 7 includes a first groove portion 76a as shown in FIGS. 1 and 4. The first groove portion 76a is recessed from the fourth side surface 76 in the y direction and extends from the top surface 71 to the bottom surface 72 in the z direction. In the present embodiment, the sealing resin 7 includes three first groove portions 76a arranged at equal intervals. Further, the number of first groove portions 76a is not limited. In the present embodiment, as shown in FIG. 1, the shape of the first groove portion 76a when viewed in z direction is rectangular. The shape of the first groove portion 76a when viewed in the z direction is not limited, but may be, for example, semicircular.

Further, in the present embodiment, as shown in FIGS. 1 and 6, the sealing resin 7 includes a second groove portion 74a. The second groove portion 74a is recessed from the second side surface 74 in the x direction and extends from the top surface 71 to the bottom surface 72 in the z direction. The second groove portion 74a is arranged between the plurality of high-voltage output-side terminals 52 and the plurality of low-voltage output-side terminals 53 on the second side surface 74. That is, the second groove portion 74a is arranged between the high-voltage output-side terminal 52b and the low-voltage output-side terminal 53a on the second side surface 74. In the present embodiment, the sealing resin 7 includes three second groove portions 74a arranged at equal intervals. Further, the number of second groove portions 74a is not limited. In the present embodiment, as shown in FIG. 1, the shape of the second groove portion 74a when viewed in the z direction is rectangular. The shape of the second groove portion 74a when viewed in the z direction is not limited, but may be, for example, semicircular.

Figure 11:
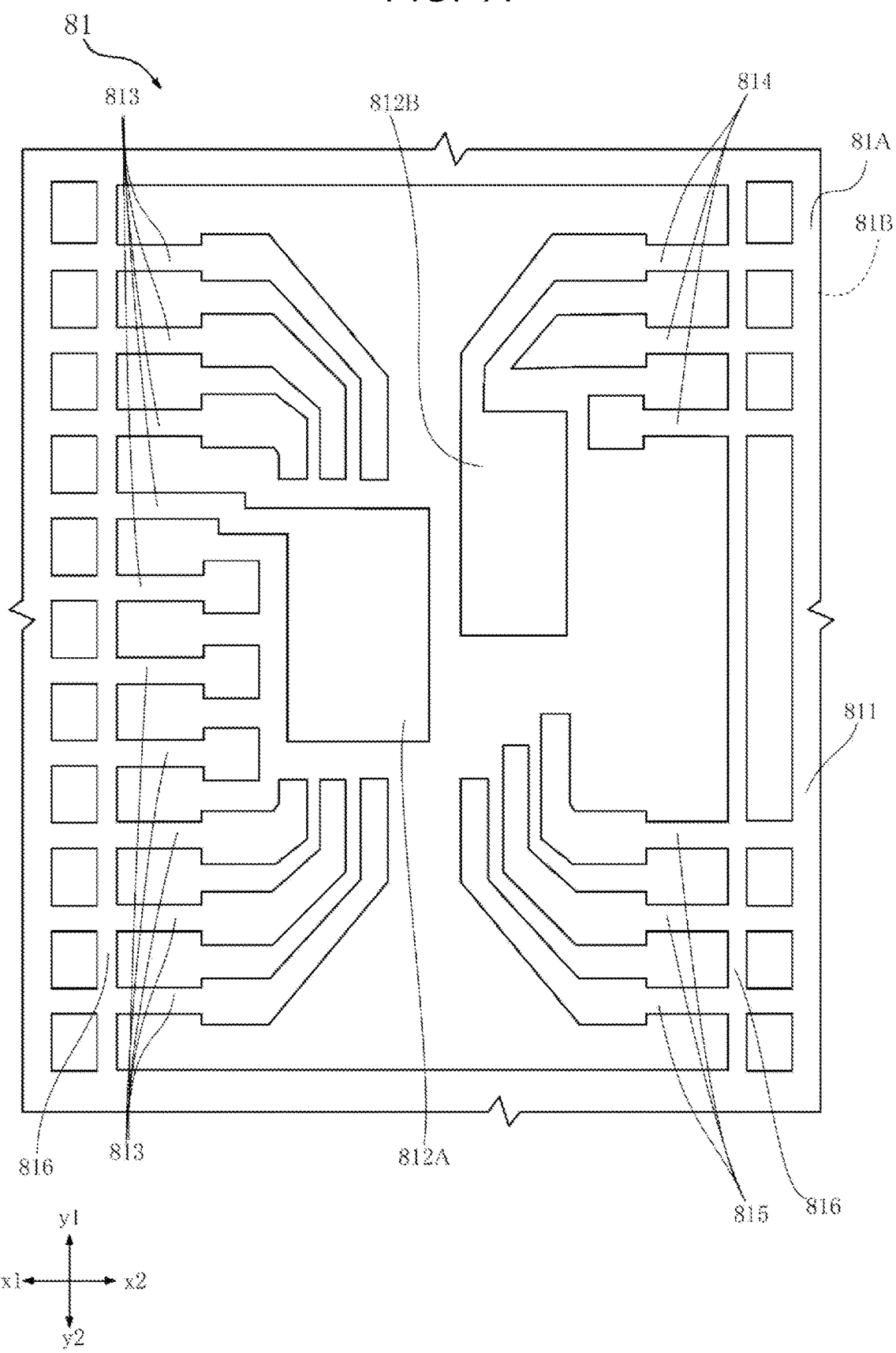
FIG. 11 is a plane view showing a step related to a manufacturing method of the semiconductor device of FIG. 1.
Figure 12:
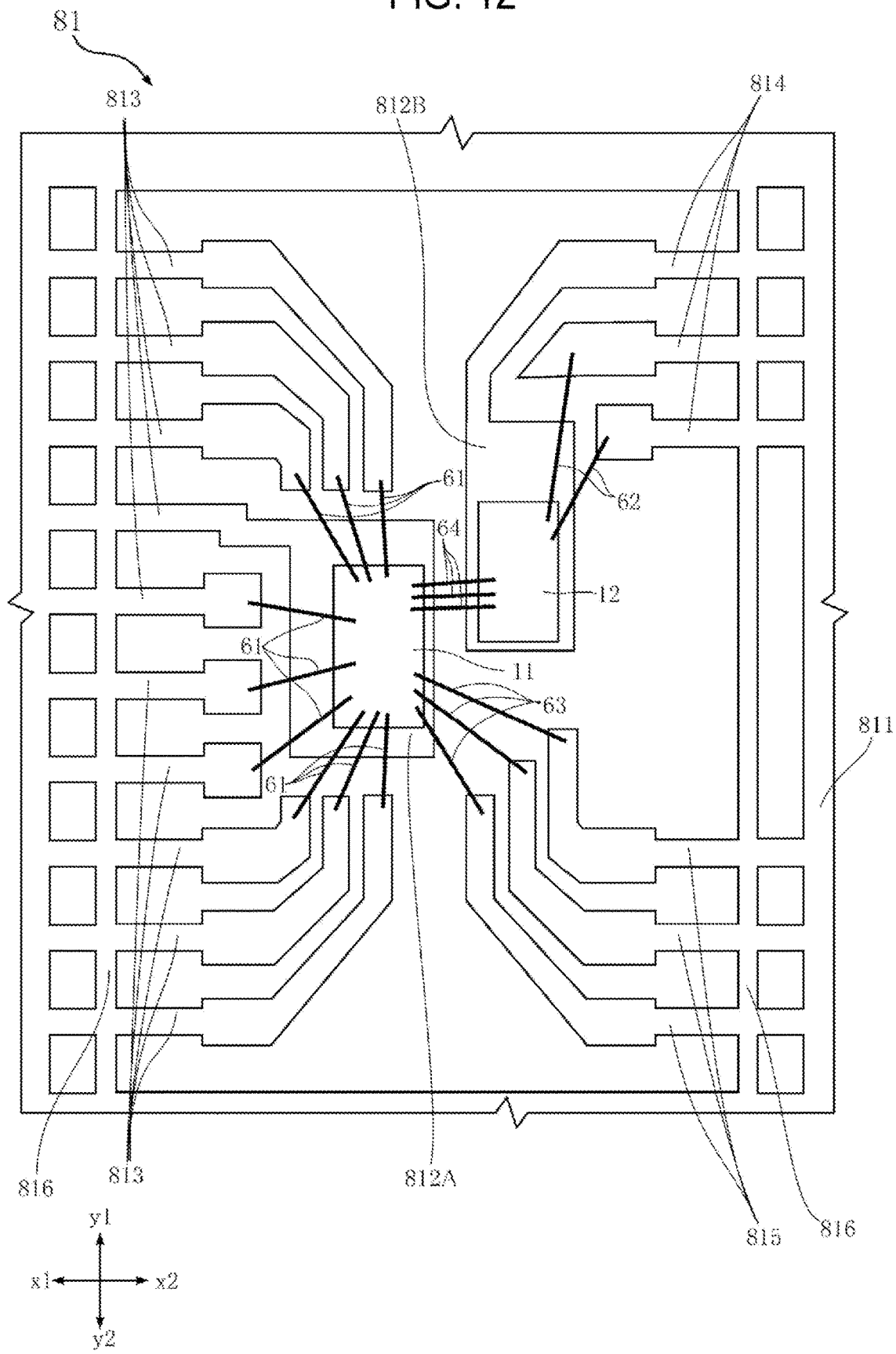
FIG. 12 is a plane view showing a step related to the manufacturing method of the semiconductor device of FIG. 1.

Next, an example of a method of manufacturing the semiconductor device A10 is described below with reference to FIGS. 11 and 12. FIGS. 11 and 12 are plane views showing steps related to a method of manufacturing the semiconductor device A10. The x direction, the y direction, and the z direction shown in these figures indicate the same directions as those in FIGS. 1 to 10.

First, as shown in FIG. 11, a lead frame 81 is prepared. The lead frame 81 is a plate-shaped material. In the present embodiment, a base material of the lead frame 81 is Cu. The lead frame 81 may be formed by subjecting a metal plate to an etching process or the like, or may be formed by subjecting a metal plate to a punching process. The lead frame 81 has a main surface 81A and a back surface 81B that are separated in the z direction. Further, the lead frame 81 includes an outer frame 811, a first die pad 812A, a second die pad 812B, a plurality of first leads 813, a plurality of second leads 814, a plurality of third leads 815, and a dam bar 816. Of these, the outer frame 811 and the dam bar 816 do not constitute the semiconductor device A10. The first die pad 812A is a portion that will later become the first die pad 3. The second die pad 812B is a portion that will later become the second die pad 4. The plurality of first leads 813 are portions that will later become the plurality of input-side terminals 51. The plurality of second leads 814 are portions that will later become the plurality of high-voltage output-side terminals 52. The plurality of third leads 815 are portions that will later become the plurality of low-voltage output-side terminals 53.

Next, as shown in FIG. 12, the first semiconductor element 11 is bonded to the first die pad 812A by die bonding, and the second semiconductor element 12 is bonded to the second die pad 812B by die bonding. After going through these steps, each of the plurality of wires 61 to 64 is formed by wire bonding.

In the step of forming the wires 61, first, a capillary is lowered toward the control part 111 of the first semiconductor element 11, and a tip of a wire is pressed against a predetermined electrode. In this operation, the tip of the wire is crimped to an electrode by an action of the capillary's own weight and an ultrasonic wave oscillated from the capillary, to perform first bonding. Then, by raising the capillary while sending out the wire, a ball bond is formed on the electrode. Next, a tip of the capillary is pressed against the bond surface by moving the capillary directly above a portion of the first lead 813 that becomes the pad part 512 of a certain one of the input-side terminals 51 and further lowering the capillary. As a result, the wire is sandwiched between the tip of the capillary and the bond surface and is crimped to the bond surface to perform second bonding. The wire is then cut by raising the capillary.

In the step of forming the wires 62, first bonding is performed on an electrode of the high-voltage drive part 121 of the second semiconductor element 12, and second bonding is performed on a portion of the second lead 814 that becomes the pad part 522 of the high-voltage output-side terminal 52. In the step of forming the wires 63, first bonding is performed on an electrode of the low-voltage drive part 112 of the first semiconductor element 11, and second bonding is performed on a portion of the third lead 815 that becomes the pad part 532 of the low-voltage output-side terminal 53. In the step of forming the wires 64, first bonding is performed on an electrode of the control part 111 of the first semiconductor element 11, and second bonding is performed on an electrode of the insulating part 122 of the second semiconductor element 12.

Next, the sealing resin 7 is formed. The sealing resin 7 is formed by transfer molding. In this step, the lead frame 81 is housed in a mold having a plurality of cavities. In this operation, in the lead frame 81, a portion of the conductive support 2 covered with the sealing resin 7 in the semiconductor device A10 is accommodated in a certain one of the plurality of cavities. After that, a fluidized resin flows from a pot through a runner into each of the plurality of cavities. After the sealing resin 7 fluidized in the plurality of cavities is solidified, resin burrs located on an outer side of each of the plurality of cavities are removed with high-pressure water or the like. With the above, the formation of the sealing resin 7 is completed.

After that, the first die pad 812A, the second die pad 812B, the plurality of first leads 813, the plurality of second leads 814, and the plurality of third leads 815, all of which are connected to each other by the outer frame 811 and the dam bar 816, are appropriately separated by dicing and individualizing. The semiconductor device A10 is manufactured by going through the steps shown above.

Next, the operations and advantages of the semiconductor device A10 are described.

According to the present embodiment, the second semiconductor element 12 relays the transmission and reception of signals between the control part 111 of the first semiconductor element 11 and the high-voltage drive part 121 of the second semiconductor element 12 and includes the insulating part 122 that insulates the control part 111 and the high-voltage drive part 121 from each other. Therefore, when a significant potential difference occurs between the control part 111 and the high-voltage drive part 121, it is possible to improve an insulation withstand voltage between the input-side circuit including the control part 111 of the first semiconductor element 11 and the high-voltage output-side circuit including the high-voltage drive part 121 of the second semiconductor element 12.

Further, according to the present embodiment, the conductive support 2 includes the first die pad 3, the second die pad 4, the plurality of input-side terminals 51, the plurality of high-voltage output-side terminals 52, and the plurality of low-voltage output-side terminals 53. The plurality of input-side terminals 51 are exposed from the first side surface 73, and the plurality of high-voltage output-side terminals 52 and the plurality of low-voltage output-side terminals 53 are exposed from the second side surface 74. On the other hand, the conductive support 2 is not exposed from the fourth side surface 76. Therefore, there is no metal portion of the conductive support 2 exposed from the sealing resin 7 between the plurality of input-side terminals 51 and the plurality of high-voltage output-side terminals 52 where a significant potential difference occurs. Therefore, an insulation distance between the plurality of input-side terminals 51 and the plurality of high-voltage output-side terminals 52 becomes long. As a result, the semiconductor device A10 has a higher insulation withstand voltage than that in a case where the conductive support 2 such as a support lead is exposed from the fourth side surface 76.

Further, according to the present embodiment, the sealing resin 7 includes the first groove portion 76a recessed from the fourth side surface 76 in the y direction. Therefore, a creepage distance from the input-side terminal 51b to the high-voltage output-side terminal 52a along the first side surface 73, the fourth side surface 76, and the second side surface 74 of the sealing resin 7 becomes longer than a case where the sealing resin 7 does not include the first groove portion 76a. As a result, the semiconductor device A10 can further improve the insulation withstand voltage.

Further, according to the present embodiment, the surface roughness of each of the top surface 71, the bottom surface 72, the first region 731 of the first side surface 73, and the second region 732 of the first side surface 73 is larger than the surface roughness of the third region 733 of the first side surface 73. Further, the surface roughness of each of the top surface 71, the bottom surface 72, the fourth region 741 of the second side surface 74, and the fifth region 742 of the second side surface 74 is also larger than the surface roughness of the sixth region 743 of the second side surface 74. Therefore, a creepage distance from the input-side terminal 51b to the high-voltage output-side terminal 52a along the first region 731 of the first side surface 73, the top surface 71, the fourth region 741 of the second side surface 74 of the sealing resin 7 and a creepage distance from the input-side terminal 51b to the high-voltage output-side terminal 52a along the second region 732 of the first side surface 73, the bottom surface 72, and the fifth region 742 of the second side surface 74 of the sealing resin 7 can become longer. As a result, the semiconductor device A10 can further improve the insulation withstand voltage.

Further, according to the present embodiment, the first distance L1 between terminals (the distance between the lead part 521 of the high-voltage output-side terminal 52b and the lead part 531 of the low-voltage output-side terminal 53a) is 5 times or more the second distance L2 between terminals (the distance between the lead parts 521 of the two adjacent high-voltage output-side terminals 52). Therefore, the lead parts 521 of the plurality of high-voltage output-side terminals 52 and the lead parts 531 of the plurality of low-voltage output-side terminals 53 are sufficiently separated in the y direction. Since the plurality of high-voltage output-side terminals 52 and the low-voltage output-side terminals 53 between which a significant potential difference occurs are sufficiently separated from each other, the semiconductor device A10 has a high insulation withstand voltage. Further, on the second side surface 74, the conductive support 2 is not exposed and has no metal portion between the high-voltage output-side terminal 52b and the low-voltage output-side terminal 53a. Therefore, the insulation distance between the plurality of high-voltage output-side terminals 52 and the plurality of low-voltage output-side terminals 53 becomes long. As a result, the semiconductor device A10 has a higher insulation withstand voltage than that in a case where the conductive support 2 such as the support lead is exposed from the second side surface 74.

Further, according to the present embodiment, the sealing resin 7 includes the second groove portion 74a recessed from the second side surface 74 in the x direction. Therefore, a creepage distance from the high-voltage output-side terminal 52b to the low-voltage output-side terminal 53a along the second side surface 74 of the sealing resin 7 becomes longer than that in a case where the sealing resin 7 does not include the second groove portion 74a. As a result, the semiconductor device A10 can further improve the insulation withstand voltage.

In the semiconductor device A10, a voltage equal to or higher than 600V is transiently applied to the high-voltage drive part 121 of the second semiconductor element 12 as compared with the ground of the control part 111 of the first semiconductor element 11. In this way, when a significant potential difference occurs between the control part 111 and the high-voltage drive part 121, further improving the insulation withstand voltage in addition to providing the insulating part 122 may improve the reliability of the semiconductor device A10.

In the present embodiment, the case where the first semiconductor element 11 including the control part 111 and the low-voltage drive part 112 is mounted on the first die pad 3 has been described, but the present disclosure is not limited thereto. For example, the first semiconductor element 11 including only the control part 111 and another semiconductor element including the low-voltage drive part 112 may be mounted on the first die pad 3. Further, in the present embodiment, the case where the second semiconductor element 12 including the high-voltage drive part 121 and the insulating part 122 is mounted on the second die pad 4 has been described, but the present disclosure is not limited thereto. For example, the second semiconductor element 12 including only the high-voltage drive part 121 and another semiconductor element including the insulating part 122 may be mounted on the second die pad 4. Further, the second semiconductor element 12 including only the high-voltage drive part 121 and another semiconductor element including the insulating part 122 may be mounted on the first die pad 3.

Further, in the present embodiment, the case where the sealing resin 7 includes the first groove portion 76a and the second groove portion 74a has been described, but the present disclosure is not limited thereto. The sealing resin 7 may not include the first groove portion 76a, or may not include the second groove portion 74a.

Further, in the present embodiment, the case where the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 of the sealing resin 7 is larger than the surface roughness of the third region 733 of the first side surface 73 and the sixth region 743 of the second side surface 74 has been described, but the present disclosure is not limited thereto. Each of the surfaces 71 to 76 of the sealing resin 7 may have the same surface roughness. In this case, the surface roughness of each of the surfaces 71 to 76 of the sealing resin 7 may be relatively small or relatively large (for example, 5 μmRz or greater and 20 μmRz or smaller).

Further, in the present embodiment, the case where the conductive support 2 is not exposed from the third side surface 75 and the fourth side surface 76 has been described, but the present disclosure is not limited thereto. A support lead may be exposed from the third side surface 75 or the fourth side surface 76.

FIGS. 13 to 19 show other embodiments of the present disclosure. Throughout these figures, the same or similar elements as those in the above embodiment are denoted by the same reference numerals as those in the above embodiment.

Second Embodiment

Figure 13:
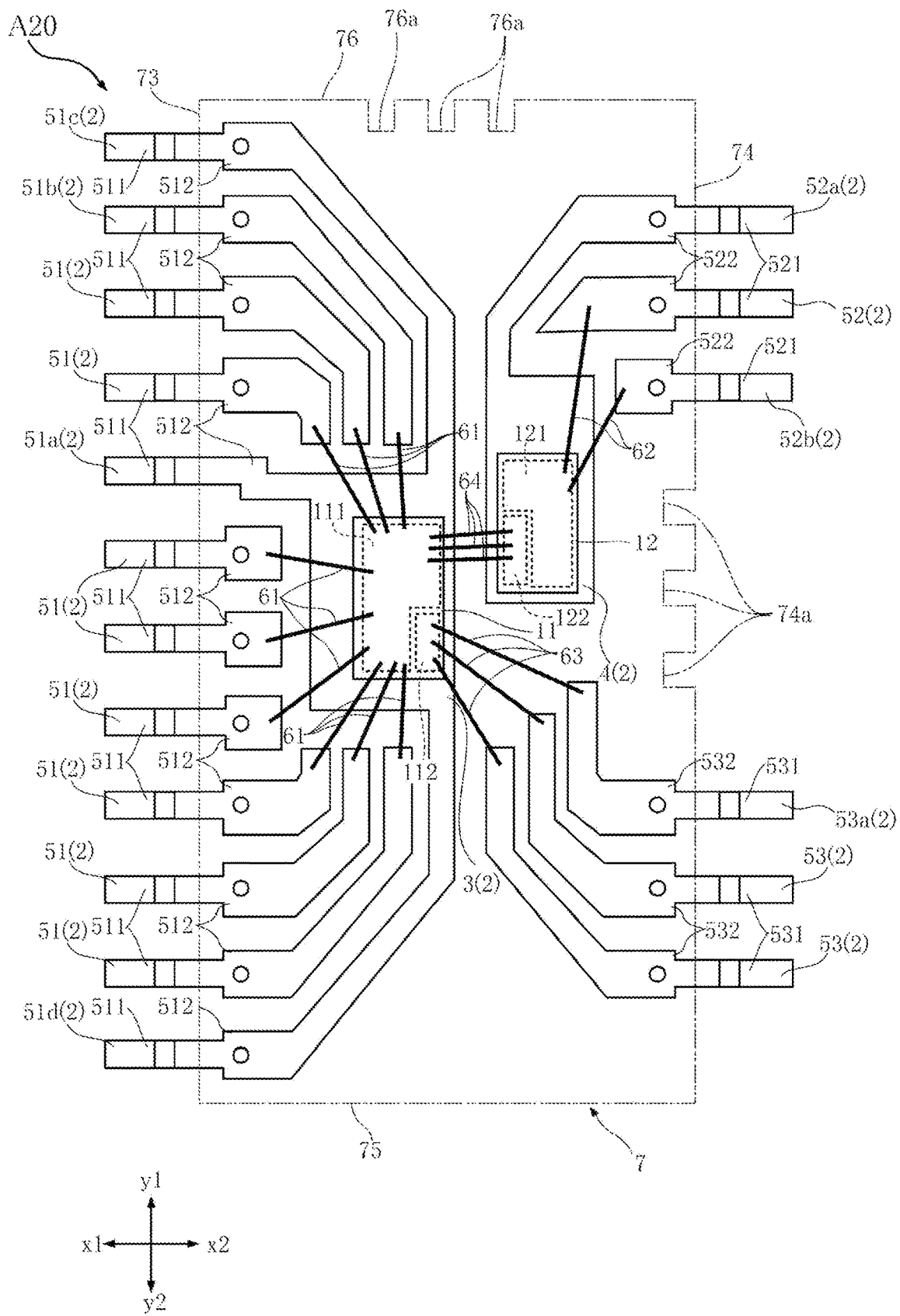
FIG. 13 is a plane view showing a semiconductor device according to a second embodiment of the present disclosure, which is a figure showing through a sealing resin.

FIG. 13 is a view for explaining a semiconductor device A20 according to a second embodiment of the present disclosure. FIG. 13 is a plane view showing the semiconductor device A20, which corresponds to FIG. 2. For convenience of understanding, FIG. 13 is illustrated through the sealing resin 7 with the outer shape of the sealing resin 7 shown by an imaginary line (two-dot chain line). The semiconductor device A20 of the present embodiment is different from the first embodiment in that the former further includes two input-side terminals 51 that support the first die pad 3.

In the present embodiment, the plurality of input-side terminals 51 further include an input-side terminal 51c and an input-side terminal 51d. The input-side terminal 51c is added to the y1 side of the input-side terminal 51b in the y direction. The input-side terminal 51c is connected, by the pad part 512, to a position (closer to the x2 side in the x direction) of the end portion (which is on the y1 side in they direction) of the first die pad 3. As a result, the input-side terminal 51c supports the first die pad 3. The input-side terminal 51d is one of the plurality of the input-side terminals 51 that is placed at the uppermost y2 side in the y direction. The input-side terminal 51d is connected, by the pad part 512, to a position (closer to the x2 side in the x direction) of the end portion (which is on the y2 side in the y direction) of the first die pad 3. As a result, the input-side terminal 51d supports the first die pad 3.

Also in the present embodiment, since the second semiconductor element 12 includes the insulating part 122, it is possible to improve the insulation withstand voltage between the input-side circuit and the high-voltage output-side circuit. Further, also in the present embodiment, since the conductive support 2 is not exposed from the fourth side surface 76, an insulation distance between the plurality of input-side terminals 51 and the plurality of high-voltage output-side terminals 52 becomes long. Further, since the sealing resin 7 includes the first groove portion 76a, a creepage distance from the input-side terminal 51c to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, a creepage distance from the input-side terminal 51c to the high-voltage output-side terminal 52a via the top surface 71 or the bottom surface 72 can become longer. Further, also in the present embodiment, since the first distance L1 between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52b and the low-voltage output-side terminal 53a, an insulation distance between the plurality of high-voltage output-side terminals 52 and the plurality of low-voltage output-side terminals 53 becomes long. Further, since the sealing resin 7 includes the second groove portion 74a, a creepage distance from the high-voltage output-side terminal 52b to the low-voltage output-side terminal 53a along the second side surface 74 of the sealing resin 7 becomes long. As a result, the semiconductor device A20 can further improve the insulation withstand voltage. Further, according to the present embodiment, the first die pad 3 is also supported by the input-side terminal 51c and the input-side terminal 51d. As a result, in the step of bonding the first semiconductor element 11 to the first die pad 3 and the step of forming the wires 61, the first die pad 3 can be made more stable.

Third Embodiment

Figure 14:
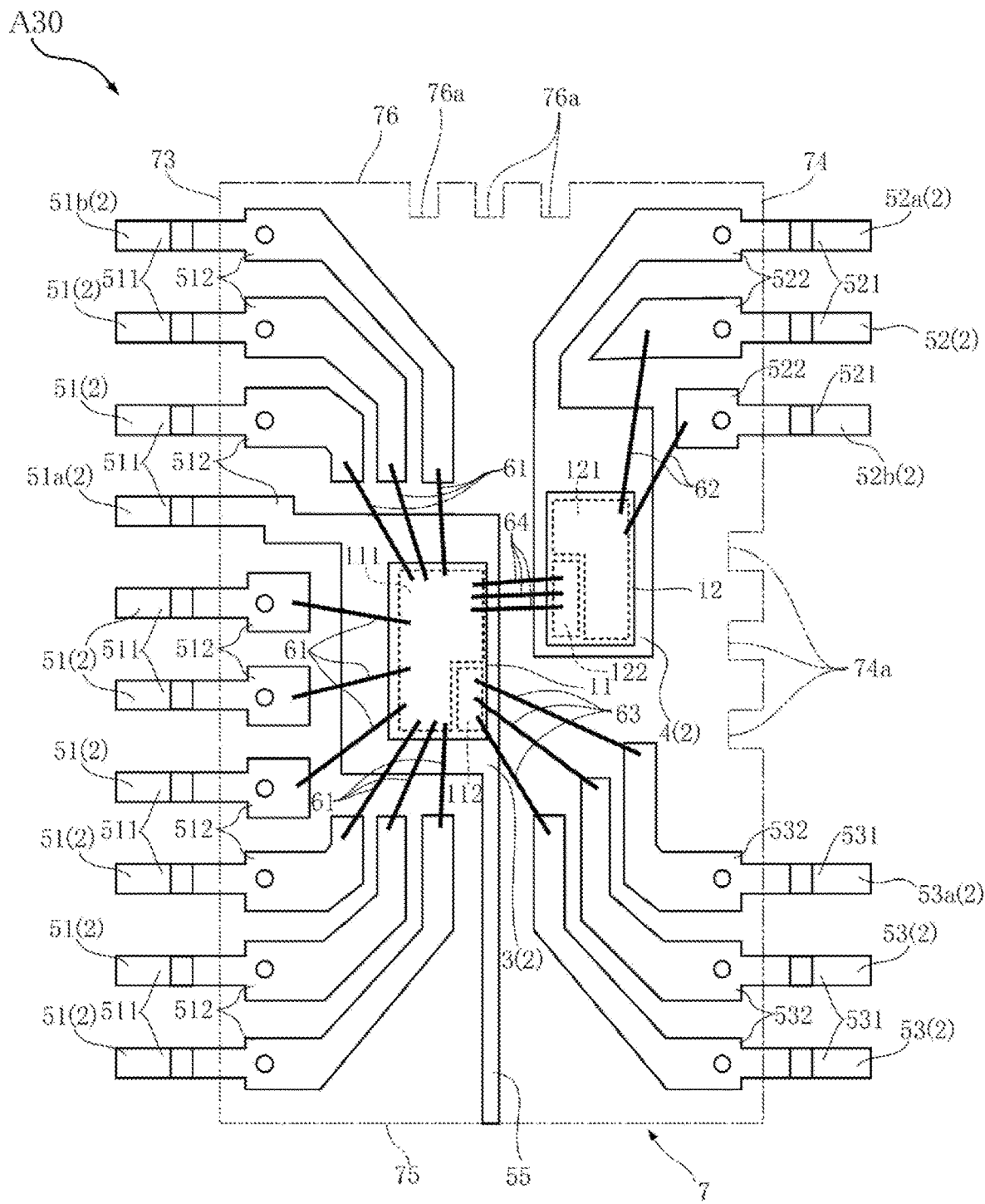
FIG. 14 is a plane view showing a semiconductor device according to a third embodiment of the present disclosure, which is a figure showing through a sealing resin.

FIG. 14 is a view for explaining a semiconductor device A30 according to a third embodiment of the present disclosure. FIG. 14 is a plane view showing the semiconductor device A30, which corresponds to FIG. 2. For convenience of understanding, FIG. 14 is illustrated through the sealing resin 7 with the outer shape of the sealing resin 7 shown by an imaginary line (two-dot chain line). The semiconductor device A30 of the present embodiment is different from the first embodiment in that the first die pad 3 is also supported by a support lead.

In the present embodiment, the conductive support 2 further includes a support lead 55. The support lead 55 has a long rectangular shape when viewed in the z direction and extends in the y direction. In the end portion on the y1 side in the y direction, the support lead 55 is connected to a position (closer to the x2 side in the x direction) of the end portion (which is on the y2 side in the y direction) of the first die pad 3, and supports the first die pad 3. The end surface of the support lead 55 on the y2 side in the y direction is exposed from the third side surface 75 of the sealing resin 7. The support lead 55 is connected to the first die pad 3 and the outer frame 811 in the lead frame 81 and is separated from the outer frame 811 in the dicing process. The cut surface here becomes the end surface on the y2 side in the y direction, and the end surface is exposed from the third side surface 75 of the sealing resin 7.

Also in the present embodiment, since the second semiconductor element 12 includes the insulating part 122, it is possible to improve the insulation withstand voltage between the input-side circuit and the high-voltage output-side circuit. Further, also in the present embodiment, since the conductive support 2 is not exposed from the fourth side surface 76, the insulation distance between the plurality of input-side terminals 51 and the plurality of high-voltage output-side terminals 52 becomes long. Further, since the sealing resin 7 includes the first groove portion 76a, the creepage distance from the input-side terminal 51b to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, the creepage distance from the input-side terminal 51b to the high-voltage output-side terminal 52a via the top surface 71 or the bottom surface 72 can become longer. Further, also in the present embodiment, since the first distance L1 between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52b and the low-voltage output-side terminal 53a, the insulation distance between the plurality of high-voltage output-side terminals 52 and the plurality of low-voltage output-side terminals 53 becomes long. Further, since the sealing resin 7 includes the second groove portion 74a, the creepage distance from the high-voltage output-side terminal 52b to the low-voltage output-side terminal 53a along the second side surface 74 of the sealing resin 7 becomes long. As a result, the semiconductor device A30 can further improve the insulation withstand voltage. Further, according to the present embodiment, the first die pad 3 is also supported by the support lead 55. As a result, in the step of bonding the first semiconductor element 11 to the first die pad 3 and the step of forming the wires 61, the first die pad 3 can be made more stable. Since the end surface of the support lead 55 is exposed from the third side surface 75, the insulation distance between the plurality of input-side terminals 51 and the plurality of low-voltage output-side terminals 53 is shortened, but no problem occurs since the potential difference between the input-side circuit including the control part 111 of the first semiconductor element 11 and the low-voltage output-side circuit including the low-voltage drive part 112 is small.

Fourth Embodiment

Figure 15:
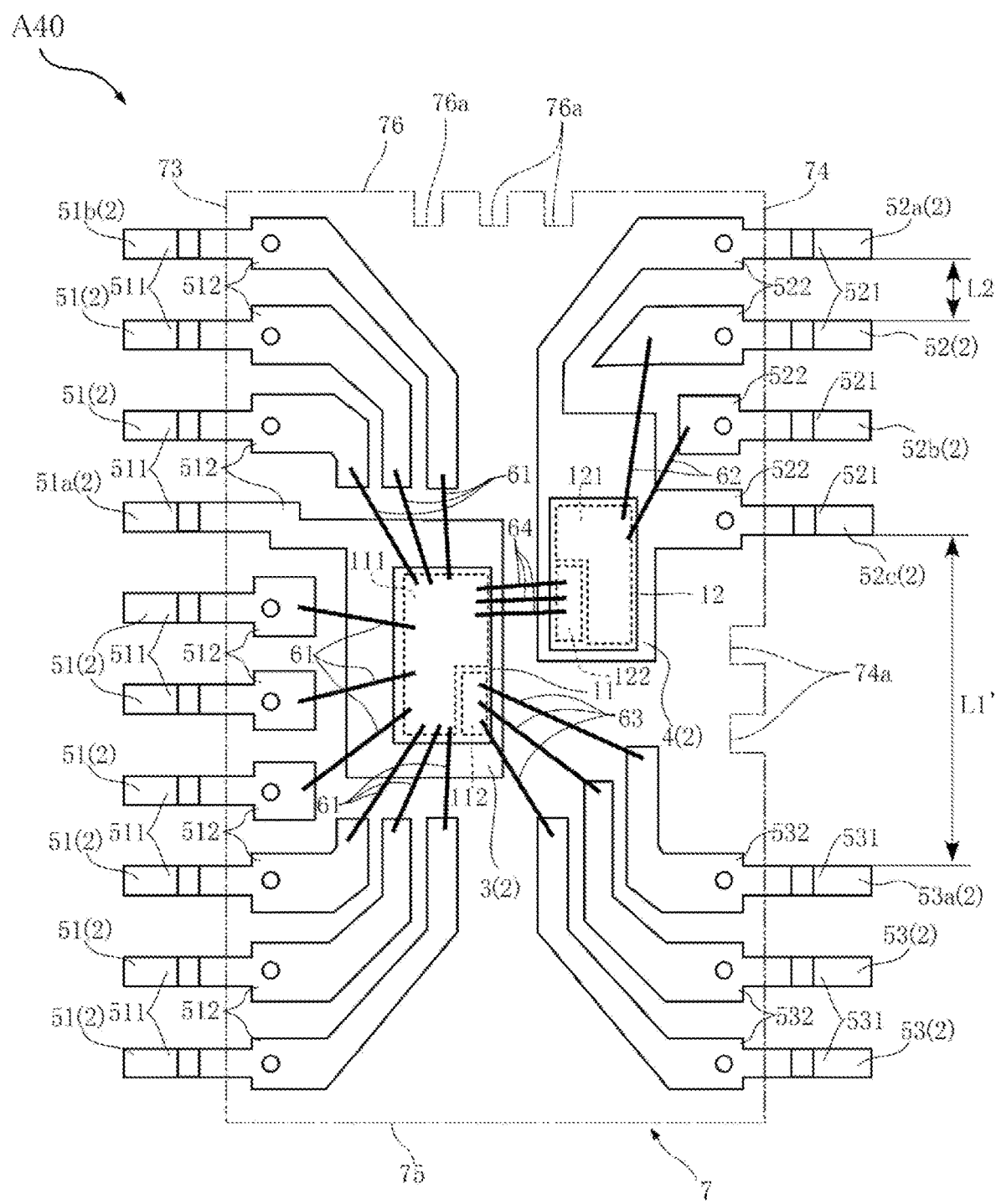
FIG. 15 is a plane view showing a semiconductor device according to a fourth embodiment of the present disclosure, which is a figure showing through a sealing resin.

FIG. 15 is a view for explaining a semiconductor device A40 according to a fourth embodiment of the present disclosure. FIG. 15 is a plane view showing the semiconductor device A40, which corresponds to FIG. 2. For convenience of understanding, FIG. 15 is illustrated through the sealing resin 7 with the outer shape of the sealing resin 7 shown by an imaginary line (two-dot chain line). The semiconductor device A40 of the present embodiment is different from the first embodiment in that the former further includes a high-voltage output-side terminal 52 that supports the second die pad 4.

In the present embodiment, the plurality of high-voltage output-side terminals 52 further include a high-voltage output-side terminal 52c. The high-voltage output-side terminal 52c is added to the y2 side of the high-voltage output-side terminal 52b in the y direction. The high-voltage output-side terminal 52c is connected by the pad part 512 to the vicinity of a y-direction center of an end portion which is on the x2 side of the second die pad 4 in the x direction. As a result, the high-voltage output-side terminal 52c supports the second die pad 4. Due to the addition of the high-voltage output-side terminal 52c, the distance between the lead parts 521 of the plurality of high-voltage output-side terminals 52 and the lead parts 531 of the plurality of low-voltage output-side terminals 53 is narrowed, but a first distance L1' between terminals, which is a distance between the lead part 521 of the high-voltage output-side terminal 52c and the lead part 531 of the low-voltage output-side terminal 53a, is 5 times or more the second distance L2 between terminals (the distance between the lead parts 521 of the two adjacent high-voltage output-side terminals 52).

Also in the present embodiment, since the second semiconductor element 12 includes the insulating part 122, it is possible to improve the insulation withstand voltage between the input-side circuit and the high-voltage output-side circuit. Further, also in the present embodiment, since the conductive support 2 is not exposed from the fourth side surface 76, the insulation distance between the plurality of input-side terminals 51 and the plurality of high-voltage output-side terminals 52 becomes long. Further, since the sealing resin 7 includes the first groove portion 76a, the creepage distance from the input-side terminal 51b to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, the creepage distance from the input-side terminal 51b to the high-voltage output-side terminal 52a via the top surface 71 or the bottom surface 72 can become longer. Further, according to the present embodiment, since the first distance L between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52c and the low-voltage output-side terminal 53a, the insulation distance between the plurality of high-voltage output-side terminals 52 and the plurality of low-voltage output-side terminals 53 becomes long. Further, since the sealing resin 7 includes the second groove portion 74a, the creepage distance from the high-voltage output-side terminal 52c to the low-voltage output-side terminal 53a along the second side surface 74 of the sealing resin 7 becomes long. As a result, the semiconductor device A40 can further improve the insulation withstand voltage. Further, according to the present embodiment, the second die pad 4 is also supported by the high-voltage output-side terminal 52c. As a result, in the step of bonding the second semiconductor element 12 to the second die pad 4 and the step of forming the wires 62, the second die pad 4 can be made more stable.

Fifth Embodiment

Figure 16:
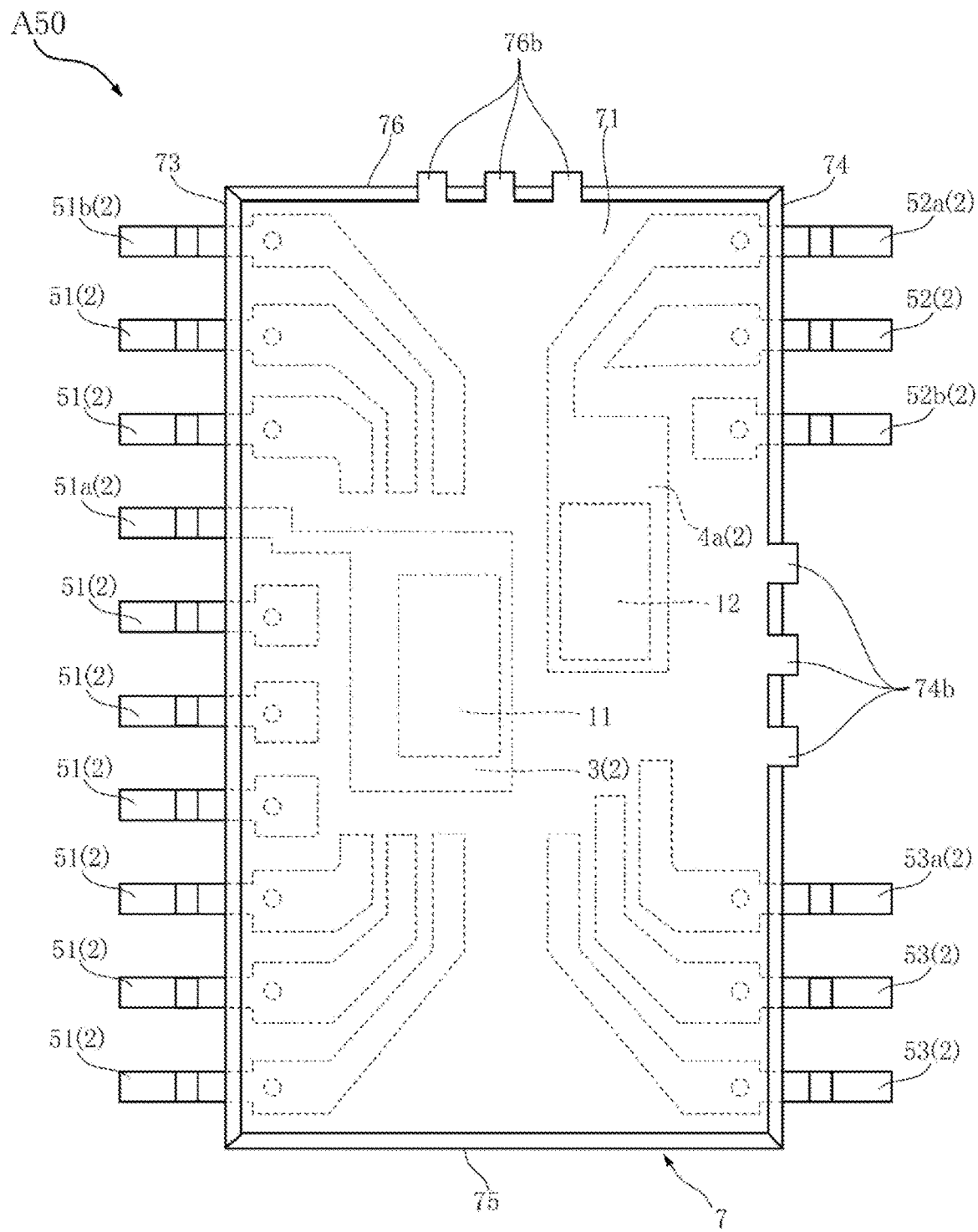
FIG. 16 is a plane view showing a semiconductor device according to a fifth embodiment of the present disclosure.

FIG. 16 is a view for explaining a semiconductor device A50 according to a fifth embodiment of the present disclosure. FIG. 16 is a plane view showing the semiconductor device A50, which corresponds to FIG. 1. The semiconductor device A50 of the present embodiment is different from the first embodiment in that the sealing resin 7 includes protruding portions instead of the first groove portion 76a and the second groove portion 74a.

In the present embodiment, the sealing resin 7 does not include the first groove portion 76a, but instead includes a first protruding portion 76b. The first protruding portion 76b protrudes from the fourth side surface 76 in the y direction and extends from the top surface 71 to the bottom surface 72 in the z direction. In the present embodiment, the sealing resin 7 includes three first protruding portions 76b arranged at equal intervals. The number of first protruding portions 76b is not limited. In the present embodiment, the shape of the first protruding portion 76b when viewed in the z direction is rectangular. The shape of the first protruding portion 76b when viewed in the z direction is not limited, but may be, for example, semicircular.

Further, in the present embodiment, the sealing resin 7 does not include the second groove portion 74a, but instead includes a second protruding portion 74b. The second protruding portion 74b protrudes from the second side surface 74 in the x direction and extends from the top surface 71 to the bottom surface 72 in the z direction. The second protruding portion 74b is arranged between the plurality of high-voltage output-side terminals 52 and the plurality of low-voltage output-side terminals 53 on the second side surface 74. That is, the second protruding portion 74b is arranged between the high-voltage output-side terminal 52b and the low-voltage output-side terminal 53a on the second side surface 74. In the present embodiment, the sealing resin 7 includes three second protruding portions 74b arranged at equal intervals. The number of second protruding portions 74b is not limited. In the present embodiment, the shape of the second protruding portion 74b when viewed in the z direction is rectangular. The shape of the second protruding portion 74b when viewed in the z direction is not limited, but may be, for example, semicircular.

Also in the present embodiment, since the second semiconductor element 12 includes the insulating part 122, it is possible to improve the insulation withstand voltage between the input-side circuit and the high-voltage output-side circuit. Further, also in the present embodiment, since the conductive support 2 is not exposed from the fourth side surface 76, the insulation distance between the plurality of input-side terminals 51 and the plurality of high-voltage output-side terminals 52 becomes long. Further, according to the present embodiment, since the sealing resin 7 includes the first protruding portion 76b, the creepage distance from the input-side terminal 51b to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, the creepage distance from the input-side terminal 51b to the high-voltage output-side terminal 52a via the top surface 71 or the bottom surface 72 can become longer. Further, also in the present embodiment, since the first distance L1 between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52b and the low-voltage output-side terminal 53a, the insulation distance between the plurality of high-voltage output-side terminals 52 and the plurality of low-voltage output-side terminals 53 becomes long. Further, according to the present embodiment, since the sealing resin 7 includes the second protruding portion 74b, the creepage distance from the high-voltage output-side terminal 52b to the low-voltage output-side terminal 53a along the second side surface 74 of the sealing resin 7 becomes long. As a result, the semiconductor device A50 can further improve the insulation withstand voltage.

Sixth Embodiment

Figure 17:
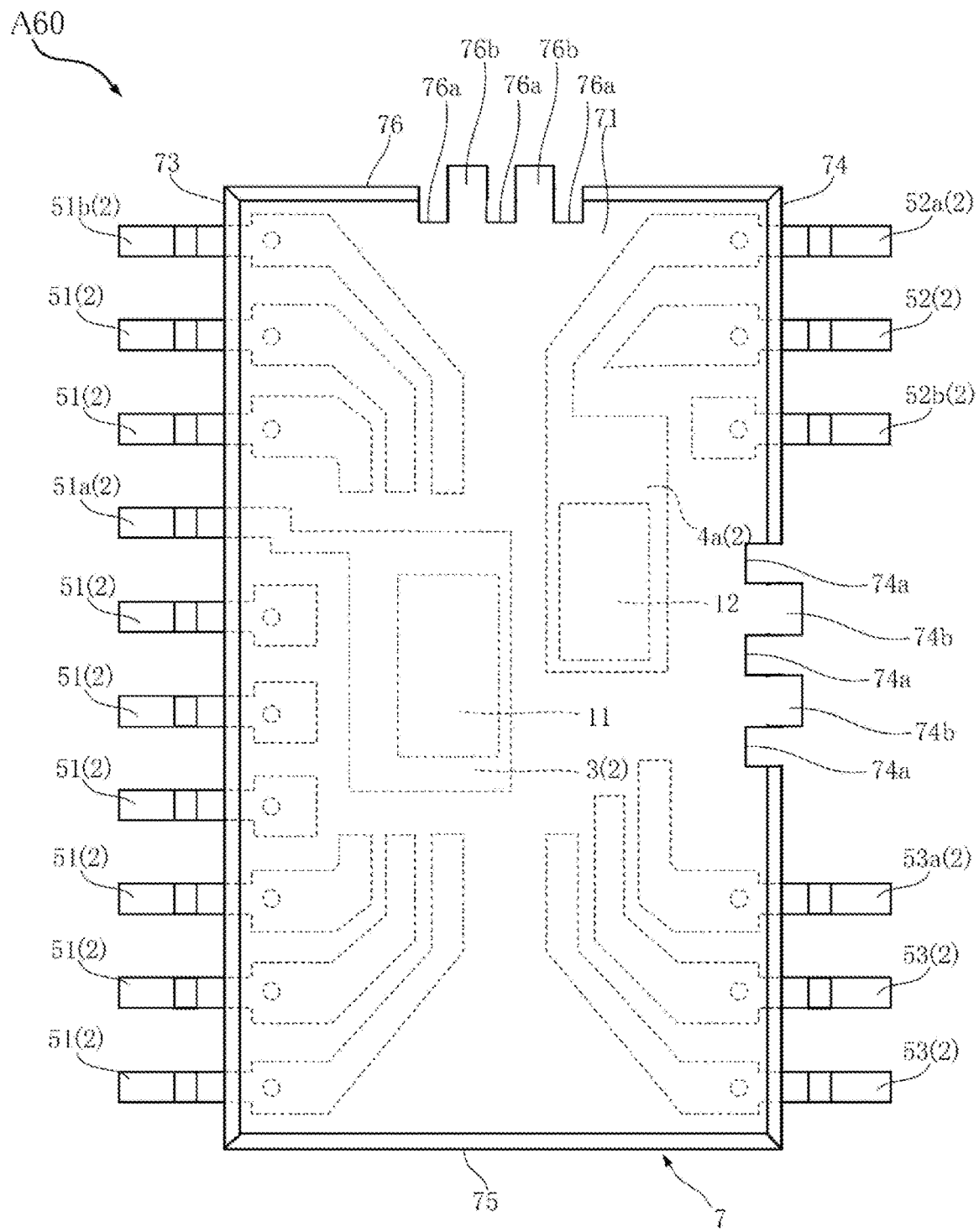
FIG. 17 is a plane view showing a semiconductor device according to a sixth embodiment of the present disclosure.

FIG. 17 is a view for explaining a semiconductor device A60 according to a sixth embodiment of the present disclosure. FIG. 17 is a plane view showing the semiconductor device A60, which corresponds to FIG. 1. The semiconductor device A60 of the present embodiment is different from the first embodiment in that the sealing resin 7 further includes protruding portions in addition to the first groove portion 76a and the second groove portion 74a.

In the present embodiment, the sealing resin 7 includes a first protruding portion 76b between adjacent first groove portions 76a. The first protruding portion 76b protrudes from the fourth side surface 76 in the y direction and extends from the top surface 71 to the bottom surface 72 in the z direction. In the present embodiment, the sealing resin 7 includes two first protruding portions 76b. The number of first protruding portions 76b is not limited. In the present embodiment, the shape of the first protruding portion 76b when viewed in the z direction is rectangular. The shape of the first protruding portion 76b when viewed in the z direction is not limited, but may be, for example, semicircular.

Further, in the present embodiment, the sealing resin 7 includes a second protruding portion 74b between adjacent second groove portions 74a. The second protruding portion 74b protrudes from the second side surface 74 in the x direction and extends from the top surface 71 to the bottom surface 72 in the z direction. In the present embodiment, the sealing resin 7 includes two second protruding portions 74b. The number of second protruding portions 74b is not limited. In the present embodiment, the shape of the second protruding portion 74b when viewed in the z direction is rectangular. The shape of the second protruding portion 74b when viewed in the z direction is not limited, but may be, for example, semicircular.

Also in this embodiment, since the second semiconductor element 12 includes the insulating part 122, it is possible to improve the insulation withstand voltage between the input-side circuit and the high-voltage output-side circuit. Further, also in the present embodiment, since the conductive support 2 is not exposed from the fourth side surface 76, the insulation distance between the plurality of input-side terminals 51 and the plurality of high-voltage output-side terminals 52 becomes long. Further, according to the present embodiment, since the sealing resin 7 includes the first groove portion 76a and the first protruding portion 76b, the creepage distance from the input-side terminal 51b to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, the creepage distance from the input-side terminal 51b to the high-voltage output-side terminal 52a via the top surface 71 or the bottom surface 72 can become longer. Further, also in the present embodiment, since the first distance L1 between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52b and the low-voltage output-side terminal 53a, the insulation distance between the plurality of high-voltage output-side terminals 52 and the plurality of low-voltage output-side terminals 53 becomes long. Further, according to the present embodiment, since the sealing resin 7 includes the second groove portion 74a and the second protruding portion 74b, the creepage distance from the high-voltage output-side terminal 52b to the low-voltage output-side terminal 53a along the second side surface 74 of the sealing resin 7 becomes long. As a result, the semiconductor device A60 can further improve the insulation withstand voltage.

Seventh Embodiment

Figure 18:
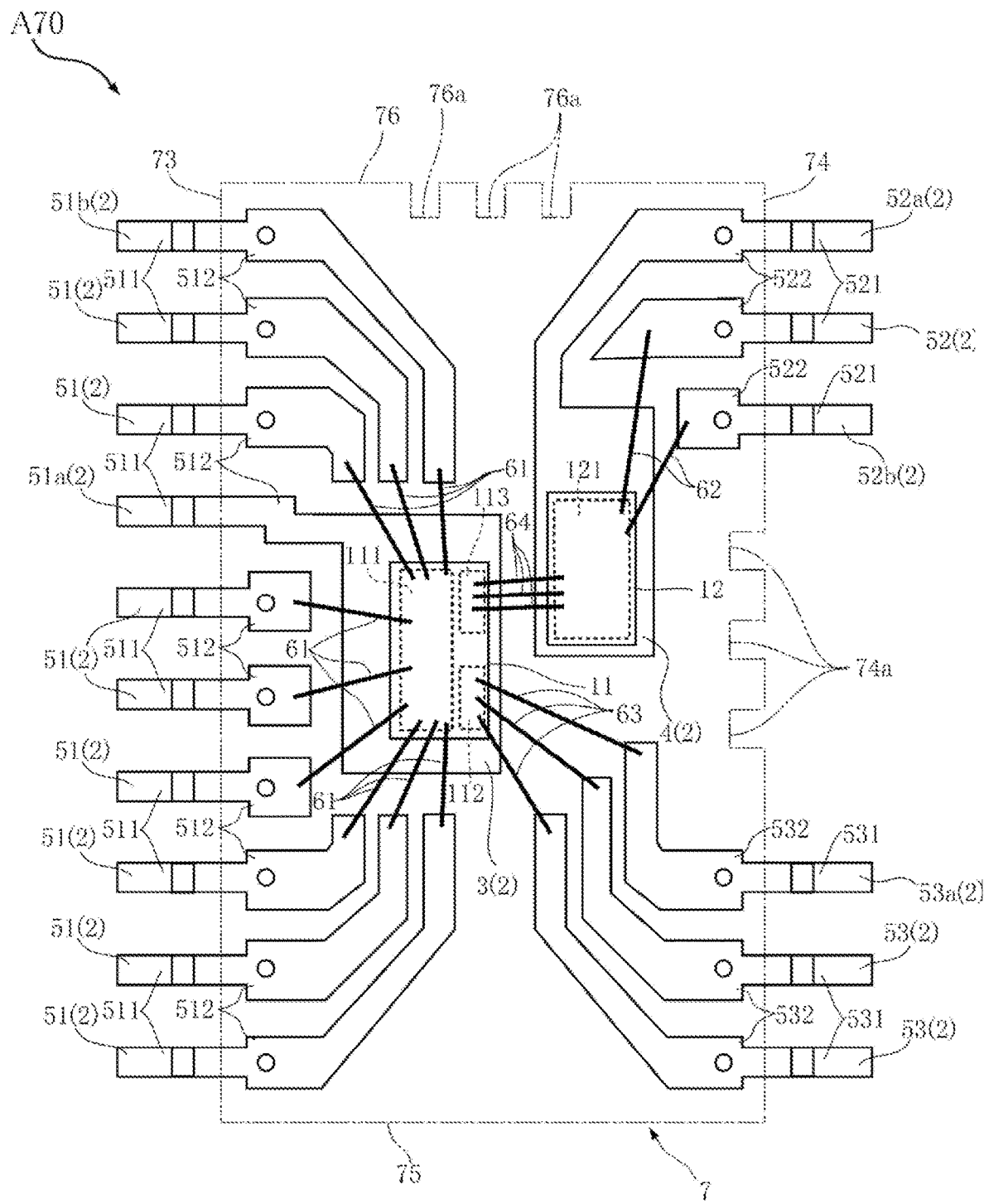
FIG. 18 is a plane view showing a semiconductor device according to a seventh embodiment of the present disclosure, which is a figure showing through a sealing resin.

FIG. 18 is a view for explaining a semiconductor device A70 according to a seventh embodiment of the present disclosure. FIG. 18 is a plane view showing the semiconductor device A70, which corresponds to FIG. 2. In FIG. 18, for convenience of understanding, the outer shape of the sealing resin 7 is shown by an imaginary line (two-dot chain line) through the sealing resin 7. The semiconductor device A70 of the present embodiment is different from the first embodiment in that the second semiconductor element 12 does not include the insulating part 122, but instead, the first semiconductor element 11 includes an insulating part.

In the present embodiment, the second semiconductor element 12 does not include the insulating part 122. On the other hand, the first semiconductor element 11 further includes an insulating part 113. The insulating part 113 is arranged on the y1 side in the y direction, and on the x2 side in the x direction of the first semiconductor element 11, and is electrically connected to the control part 111 inside the first semiconductor element 11. The insulating part 113 is a portion for transmitting a PWM control signal in an insulated state and has the same configuration as the insulating part 122. The insulating part 113 receives the PWM control signal from the control part 111 and transmits the received PWM control signal to the high-voltage drive part 121 of the second semiconductor element 12 in an insulated state via the wires 64. That is, the insulating part 113 relays the transmission and reception of signals between the control part 111 of the first semiconductor element 11 and the high-voltage drive part 121 of the second semiconductor element 12 and insulates the control part 111 of the first semiconductor element 11 and the high-voltage drive part 121 of the second semiconductor element 12 from each other.

According to the present embodiment, since the first semiconductor element 11 includes the insulating part 113, it is possible to improve the insulation withstand voltage between the input-side circuit and the high-voltage output-side circuit. Further, also in the present embodiment, since the conductive support 2 is not exposed from the fourth side surface 76, the insulation distance between the plurality of input-side terminals 51 and the plurality of high-voltage output-side terminals 52 becomes long. Further, since the sealing resin 7 includes the first groove portion 76a, the creepage distance from the input-side terminal 51b to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, the creepage distance from the input-side terminal 51b to the high-voltage output-side terminal 52a via the top surface 71 or the bottom surface 72 can become longer. Further, also in the present embodiment, since the first distance L1 between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52b and the low-voltage output-side terminal 53a, the insulation distance between the plurality of high-voltage output-side terminals 52 and the plurality of low-voltage output-side terminals 53 becomes long. Further, since the sealing resin 7 includes the second groove portion 74a, the creepage distance from the high-voltage output-side terminal 52b to the low-voltage output-side terminal 53a along the second side surface 74 of the sealing resin 7 becomes long. As a result, the semiconductor device A70 can further improve the insulation withstand voltage.

In the present embodiment, the case where the first semiconductor element 11 including the control part 111, the low-voltage drive part 112, and the insulating part 113 is mounted on the first die pad 3 has been described, but the present disclosure is not limited thereto. For example, the first semiconductor element 11 including only the control part 111 and the low-voltage drive part 112 and another semiconductor element including the insulating part 113 may be mounted on the first die pad 3. Further, the first semiconductor element 11 including only the control part 111, another semiconductor element including the low-voltage drive part 112, and another semiconductor element including the insulating part 113 may be mounted on the first die pad 3.

Eighth Embodiment

Figure 19:
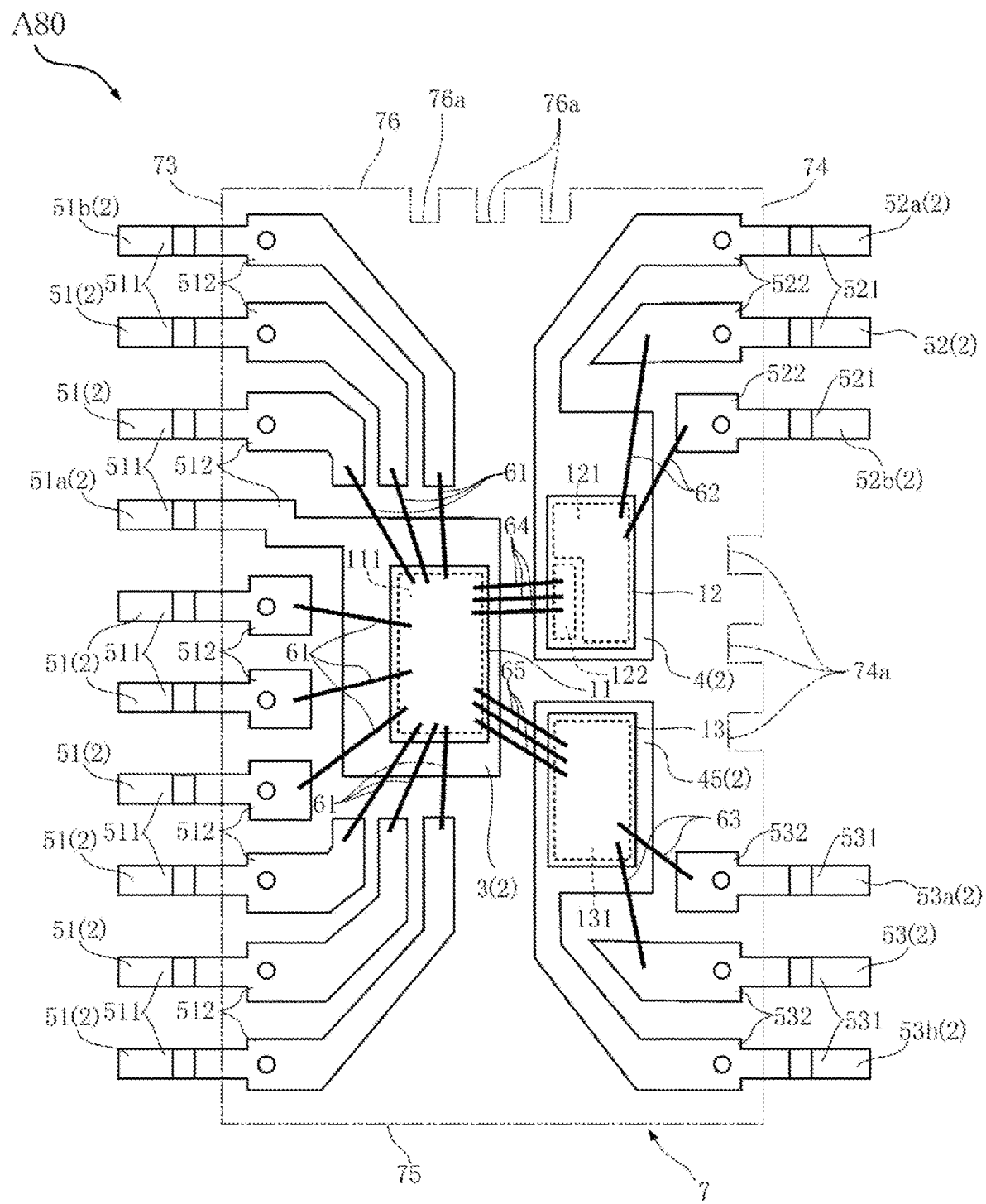
FIG. 19 is a plane view showing a semiconductor device according to an eighth embodiment of the present disclosure, which is a figure showing through a sealing resin.

FIG. 19 is a view for explaining a semiconductor device A80 according to an eighth embodiment of the present disclosure. FIG. 19 is a plane view showing the semiconductor device A80, which corresponds to FIG. 2. For convenience of understanding, FIG. 19 is illustrated through the sealing resin 7 with the outer shape of the sealing resin 7 shown by an imaginary line (two-dot chain line). The semiconductor device A80 of the present embodiment is different from the first embodiment in that the first semiconductor element 11 does not include the low-voltage drive part 112, but instead, a semiconductor element including the low-voltage drive part is mounted on a die pad constituting a low-voltage output-side circuit.

In the present embodiment, the first semiconductor element 11 does not include the low-voltage drive part 112. The semiconductor device A80 further includes a third semiconductor element 13, a third die pad 45, and wires 65.

The third semiconductor element 13 is mounted on the third die pad 45 and is arranged on the x2 side of the first semiconductor element 11 in the x direction on the y2 side of the second semiconductor element 12 in the y direction. The third semiconductor element 13 has a long rectangular shape in the y direction when viewed in the z direction. The third semiconductor element 13 has a substrate (not shown) made of Si, and a low-voltage drive part 131 is formed on the substrate. The low-voltage drive part 131 has the same configuration as the low-voltage drive part 112 of the first semiconductor element 11 according to the first embodiment. The low-voltage drive part 131 receives the PWM control signal from the control part 111 of the first semiconductor element 11 via the wires 65 and drives a low-side switching element. A plurality of electrodes (not shown) are provided on the upper surface (the surface facing the z1 side) of the third semiconductor element 13. Further, a back surface electrode (not shown) is provided on the lower surface (the surface facing the z2 side) of the third semiconductor element 13. These electrodes are electrically connected to a circuit configured in the third semiconductor element 13.

The third semiconductor element 13 is mounted on the third die pad 45. The third die pad 45 is electrically connected to the back surface electrode of the third semiconductor element 13 and is an element of the above-mentioned low-voltage output-side circuit. The third die pad 45 has, for example, substantially a rectangular shape when viewed in the z direction. The third semiconductor element 13 is bonded to the third die pad 45 by a conductive bonding material (not shown). In the present embodiment, the plurality of low-voltage output-side terminals 53 are appropriately electrically connected to the low-voltage drive part 131 of the third semiconductor element 13. Of the plurality of low-voltage output-side terminals 53, the low-voltage output-side terminal 53b arranged on the uppermost y2 side in the y direction is connected, by the pad part 532, to a position (closer to the x1 side in the x direction) of the end portion (which is on the y2 side in the y direction) of the third die pad 45, and supports the third die pad 45.

Also in this embodiment, since the second semiconductor element 12 includes the insulating part 122, it is possible to improve the insulation withstand voltage between the input-side circuit and the high-voltage output-side circuit. Further, also in the present embodiment, since the conductive support 2 is not exposed from the fourth side surface 76, the insulation distance between the plurality of input-side terminals 51 and the plurality of high-voltage output-side terminals 52 becomes long. Further, since the sealing resin 7 includes the first groove portion 76a, the creepage distance from the input-side terminal 51b to the high-voltage output-side terminal 52a via the fourth side surface 76 becomes long. Further, the surface roughness of each of the top surface 71, the bottom surface 72, the first region 731 of the first side surface 73, the second region 732 of the first side surface 73, the fourth region 741 of the second side surface 74, and the fifth region 742 of the second side surface 74 is larger than the surface roughness of the third region 733 of the first side surface 73 and the sixth region 743 of the second side surface 74. Therefore, the creepage distance from the input-side terminal 51b to the high-voltage output-side terminal 52a via the top surface 71 or the bottom surface 72 can become longer. Further, also in the present embodiment, since the first distance L1 between terminals is 5 times or more the second distance L2 between terminals, the lead parts 521 of the plurality of high-voltage output-side terminals 52 and the lead parts 531 of the plurality of low-voltage output-side terminals 53 are sufficiently separated from each other in the y direction. Further, on the second side surface 74, since the conductive support 2 is not exposed between the high-voltage output-side terminal 52b and the low-voltage output-side terminal 53a, the insulation distance between the plurality of high-voltage output-side terminals 52 and the plurality of low-voltage output-side terminals 53 becomes long. Further, since the sealing resin 7 includes the second groove portion 74a, the creepage distance from the high-voltage output-side terminal 52b to the low-voltage output-side terminal 53a along the second side surface 74 of the sealing resin 7 becomes long. As a result, the semiconductor device A80 can further improve the insulation withstand voltage.

The semiconductor device according to the present disclosure is not limited to the above-described embodiments. The specific configuration of each part of the semiconductor device according to the present disclosure can be freely changed in design in various ways.

Supplementary Note 1

A semiconductor device comprising:
a conductive support including a first die pad and a second die pad having a potential different from a potential of the first die pad;
a first semiconductor element mounted on the first die pad;
a second semiconductor element mounted on the second die pad; and
a sealing resin that covers the first semiconductor element, the second semiconductor element, and at least a portion of the conductive support,
wherein the first semiconductor element includes:
a control part constituting an input-side circuit together with the first die pad; and
a low-voltage drive part constituting a low-voltage output-side circuit that transmits and receives a signal to and from the input-side circuit,
wherein the second semiconductor element includes a high-voltage drive part constituting a high-voltage output-side circuit, which transmits and receives a signal to and from the input-side circuit, together with the second die pad,
wherein the conductive support further includes:
a plurality of input-side terminals arranged along a first direction orthogonal to a thickness direction, at least one of the plurality of input-side terminals being electrically connected to the input-side circuit;
a plurality of high-voltage output-side terminals arranged along the first direction, at least one of the plurality of high-voltage output-side terminals being electrically connected to the high-voltage output-side circuit; and
a plurality of low-voltage output-side terminals arranged along the first direction on one side of the first direction with respect to the plurality of high-voltage output-side terminals, at least one of the plurality of low-voltage output-side terminals being electrically connected to the low-voltage output-side circuit,
wherein the sealing resin has:
a first side surface located on a first side in a second direction orthogonal to the thickness direction and the first direction, the plurality of input-side terminals protruding from the first side surface;
a second side surface located on a second side in the second direction, the plurality of high-voltage output-side terminals and the plurality of low-voltage output-side terminals protruding from the second side surface;
a third side surface located on a first side in the first direction and connected to the first side surface and the second side surface; and
a fourth side surface located on a second side of the first direction and connected to the first side surface and the second side surface, and
wherein the conductive support is not exposed from the fourth side surface.

Supplementary Note 2

The semiconductor device of Supplementary Note 1, wherein the second semiconductor element further includes an insulating part that relays transmission and reception of a signal between the input-side circuit and the high-voltage output-side circuit and insulates the input-side circuit and the high-voltage output-side circuit from each other.

Supplementary Note 3

The semiconductor device of Supplementary Note 1, wherein the first semiconductor element further includes an insulating part that relays transmission and reception of a signal between the input-side circuit and the high-voltage output-side circuit and insulates the input-side circuit and the high-voltage output-side circuit from each other.

Supplementary Note 4

The semiconductor device of any one of Supplementary Notes 1 to 3, wherein the conductive support is not exposed from the third side surface.

Supplementary Note 5

The semiconductor device of any one of Supplementary Notes 1 to 4, wherein the plurality of high-voltage output-side terminals include an inner high-voltage output-side terminal arranged on an uppermost side in the first direction, and
wherein the plurality of low-voltage output-side terminals include an inner low-voltage output-side terminal arranged on another uppermost side in the first direction.

Supplementary Note 6

The semiconductor device of Supplementary Note 5, wherein a first distance between terminals, which is a distance between a portion of the inner high-voltage output-side terminal exposed from the sealing resin and a portion of the inner low-voltage output-side terminal exposed from the sealing resin, is 5 times or more a second distance between terminals, which is a maximum value of a distance between portions of two adjacent high-voltage output-side terminals exposed from the sealing resin.

Supplementary Note 7

The semiconductor device of Supplementary Note 5 or 6, wherein the conductive support is not exposed between the inner high-voltage output-side terminal and the inner low-voltage output-side terminal on the second side surface.

Supplementary Note 8

The semiconductor device of any one of Supplementary Notes 5 to 7, wherein the plurality of high-voltage output-side terminals include only one support terminal connected to the second die pad, and
wherein the support terminal is different from the inner high-voltage output-side terminal.

Supplementary Note 9

The semiconductor device of any one of Supplementary Notes 1 to 8, wherein the number of high-voltage output-side terminals is three, and the number of low-voltage output-side terminals is three.

Supplementary Note 10

The semiconductor device of any one of Supplementary Notes 1 to 9, wherein the sealing resin further includes a first groove portion that is recessed from the fourth side surface in the first direction and extends in the thickness direction.

Supplementary Note 11

The semiconductor device of any one of Supplementary Notes 1 to 10, wherein the sealing resin further includes a first protruding portion that protrudes from the fourth side surface in the first direction and extends in the thickness direction.

Supplementary Note 12

The semiconductor device of any one of Supplementary Notes 1 to 11, wherein the sealing resin further includes a second groove portion that is recessed from the second side surface in the second direction and extends in the thickness direction, and
wherein the second groove portion is arranged between the plurality of high-voltage output-side terminals and the plurality of low-voltage output-side terminals in the first direction.

Supplementary Note 13

The semiconductor device of any one of Supplementary Notes 1 to 12, wherein the sealing resin further includes a second protruding portion that protrudes from the second side surface in the second direction and extends in the thickness direction, and wherein the second protruding portion is arranged between the plurality of high-voltage output-side terminals and the plurality of low-voltage output-side terminals in the first direction.

Supplementary Note 14

The semiconductor device of any one of Supplementary Notes 1 to 13, wherein the sealing resin further has a top surface facing a side where the first semiconductor element is located with respect to the first die pad in the thickness direction, and a bottom surface facing a side opposite to the top surface in the thickness direction,
wherein the first side surface includes a first region connected to the top surface, a second region connected to the bottom surface, and a third region that is connected to the first region and the second region and from which the plurality of input-side terminals protrude, and
wherein a surface roughness of each of the top surface, the bottom surface, the first region, and the second region of the first side surface is larger than a surface roughness of the third region of the first side surface.

Supplementary Note 15

The semiconductor device of Supplementary Note 14, wherein the second side surface includes a fourth region connected to the top surface, a fifth region connected to the bottom surface, and a sixth region that is connected to the fourth region and the fifth region and from which the plurality of high-voltage output-side terminals and the plurality of low-voltage output-side terminals protrude, and
wherein a surface roughness of each of the top surface, the bottom surface, the fourth region, and the fifth region is larger than a surface roughness of the sixth region.

Supplementary Note 16

The semiconductor device of Supplementary Note 14 or 15, wherein the surface roughness of each of the top surface and the bottom surface is 5 μmRz or greater and 20 μmRz or smaller.

According to the present disclosure in some embodiments, the conductive support is not exposed from the fourth side surface of the sealing resin. Therefore, the insulation distance between the plurality of input-side terminals and the plurality of high-voltage output-side terminals becomes long. As a result, the insulation withstand voltage can be improved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device comprising:
a conductive support including a first die pad and a second die pad having a potential different from a potential of the first die pad;
a first semiconductor element mounted on the first die pad;
a second semiconductor element mounted on the second die pad; and
a sealing resin that covers the first semiconductor element, the second semiconductor element, and at least a portion of the conductive support,
wherein the first semiconductor element includes:
a control part constituting an input-side circuit together with the first die pad; and
a low-voltage drive part constituting a low-voltage output-side circuit that transmits and receives a signal to and from the input-side circuit,
wherein the second semiconductor element includes a high-voltage drive part constituting a high-voltage out- put-side circuit, which transmits and receives a signal to and from the input-side circuit, together with the second die pad,
wherein the conductive support further includes:
a plurality of input-side terminals arranged along a first direction orthogonal to a thickness direction, at least one of the plurality of input-side terminals being electrically connected to the input-side circuit;
a plurality of high-voltage output-side terminals arranged along the first direction, at least one of the plurality of high-voltage output-side terminals being electrically connected to the high-voltage output-side circuit; and
a plurality of low-voltage output-side terminals arranged along the first direction on one side of the first direction with respect to the plurality of high-voltage output-side terminals, at least one of the plurality of low-voltage output-side terminals being electrically connected to the low-voltage output-side circuit,
wherein the sealing resin has:
a first side surface located on a first side in a second direction orthogonal to the thickness direction and the first direction, the plurality of input-side terminals protruding from the first side surface;
a second side surface located on a second side in the second direction, the plurality of high-voltage output-side terminals and the plurality of low-voltage output-side terminals protruding from the second side surface;
a third side surface located on a first side in the first direction and connected to the first side surface and the second side surface; and
a fourth side surface located on a second side of the first direction and connected to the first side surface and the second side surface, and
wherein the conductive support is not exposed from the fourth side surface.

2. The semiconductor device of claim 1, wherein the second semiconductor element further includes an insulating part that relays transmission and reception of a signal between the input-side circuit and the high-voltage output-side circuit and insulates the input-side circuit and the high-voltage output-side circuit from each other.

3. The semiconductor device of claim 1, wherein the first semiconductor element further includes an insulating part that relays transmission and reception of a signal between the input-side circuit and the high-voltage output-side circuit and insulates the input-side circuit and the high-voltage output-side circuit from each other.

4. The semiconductor device of claim 1, wherein the conductive support is not exposed from the third side surface.

5. The semiconductor device of claim 1, wherein the plurality of high-voltage output-side terminals include an inner high-voltage output-side terminal arranged on an uppermost side in the first direction, and
wherein the plurality of low-voltage output-side terminals include an inner low-voltage output-side terminal arranged on another uppermost side in the first direction.

6. The semiconductor device of claim 5, wherein a first distance between terminals, which is a distance between a portion of the inner high-voltage output-side terminal exposed from the sealing resin and a portion of the inner low-voltage output-side terminal exposed from the sealing resin, is 5 times or more a second distance between terminals, which is a maximum value of a distance between portions of two adjacent high-voltage output-side terminals exposed from the sealing resin.

7. The semiconductor device of claim 5, wherein the conductive support is not exposed between the inner high-voltage output-side terminal and the inner low-voltage output-side terminal on the second side surface.

8. The semiconductor device of claim 5, wherein the plurality of high-voltage output-side terminals include only one support terminal connected to the second die pad, and
wherein the support terminal is different from the inner high-voltage output-side terminal.

9. The semiconductor device of claim 1, wherein the number of high-voltage output-side terminals is three, and the number of low-voltage output-side terminals is three.

10. The semiconductor device of claim 1, wherein the sealing resin further includes a first groove portion that is recessed from the fourth side surface in the first direction and extends in the thickness direction.

11. The semiconductor device of claim 1, wherein the sealing resin further includes a first protruding portion that protrudes from the fourth side surface in the first direction and extends in the thickness direction.

12. The semiconductor device of claim 1, wherein the sealing resin further includes a second groove portion that is recessed from the second side surface in the second direction and extends in the thickness direction, and
wherein the second groove portion is arranged between the plurality of high-voltage output-side terminals and the plurality of low-voltage output-side terminals in the first direction.

13. The semiconductor device of claim 1, wherein the sealing resin further includes a second protruding portion that protrudes from the second side surface in the second direction and extends in the thickness direction, and
wherein the second protruding portion is arranged between the plurality of high-voltage output-side terminals and the plurality of low-voltage output-side terminals in the first direction.

14. The semiconductor device of claim 1, wherein the sealing resin further has a top surface facing a side where the first semiconductor element is located with respect to the first die pad in the thickness direction, and a bottom surface facing a side opposite to the top surface in the thickness direction,
wherein the first side surface includes a first region connected to the top surface, a second region connected to the bottom surface, and a third region that is connected to the first region and the second region and from which the plurality of input-side terminals protrude, and
wherein a surface roughness of each of the top surface, the bottom surface, the first region, and the second region of the first side surface is larger than a surface roughness of the third region of the first side surface.

15. The semiconductor device of claim 14, wherein the second side surface includes a fourth region connected to the top surface, a fifth region connected to the bottom surface, and a sixth region that is connected to the fourth region and the fifth region and from which the plurality of high-voltage output-side terminals and the plurality of low-voltage output-side terminals protrude, and
wherein a surface roughness of each of the top surface, the bottom surface, the fourth region, and the fifth region is larger than a surface roughness of the sixth region.

16. The semiconductor device of claim 14, wherein the surface roughness of each of the top surface and the bottom surface is 5 μmRz or greater and 20 μmRz or smaller.

* * * * *